US011639972B1

(12) United States Patent
Opperman et al.

(10) Patent No.: US 11,639,972 B1
(45) Date of Patent: May 2, 2023

(54) DYNAMIC MAGNETIC VECTOR FLUXGATE MAGNETOMETER AND METHODS OF USING

(71) Applicant: Orbital Research Inc., Cleveland, OH (US)

(72) Inventors: Anthony Opperman, Wickliffe, OH (US); Edward J. Rapp, Cleveland Heights, OH (US)

(73) Assignee: Orbital Research Inc., Cleveland, OH (US)

( * ) Notice: Subject to any disclaimer, the term of this patent is extended or adjusted under 35 U.S.C. 154(b) by 0 days.

(21) Appl. No.: 17/844,101

(22) Filed: Jun. 20, 2022

Related U.S. Application Data

(63) Continuation of application No. 17/120,731, filed on Dec. 14, 2020, now Pat. No. 11,397,221, which is a continuation of application No. 16/357,916, filed on Mar. 19, 2019, now Pat. No. 10,895,611.

(60) Provisional application No. 62/647,207, filed on Mar. 23, 2018.

(51) Int. Cl.
G01R 33/00 (2006.01)
G01R 33/04 (2006.01)

(52) U.S. Cl.
CPC ......... *G01R 33/0035* (2013.01); *G01R 33/04* (2013.01)

(58) Field of Classification Search
CPC .............................. G01R 33/0035; G01R 33/04
USPC ........................................ 324/202, 244, 245
See application file for complete search history.

(56) References Cited

U.S. PATENT DOCUMENTS

| 4,386,318 | A | * | 5/1983 | Burbank | G01R 33/022 324/245 |
| 7,038,458 | B1 | * | 5/2006 | Wiegert | G01V 3/081 324/345 |
| 7,275,008 | B2 | * | 9/2007 | Plyvanainen | G01C 25/00 702/92 |
| 2006/0164073 | A1 | * | 7/2006 | Bergsma | G01R 33/0206 324/202 |
| 2010/0271009 | A1 | * | 10/2010 | Zeller | G01V 3/081 324/202 |
| 2012/0062209 | A1 | * | 3/2012 | Teppan | G01R 19/20 324/76.75 |
| 2012/0101766 | A1 | * | 4/2012 | Snow | G01C 17/38 324/202 |
| 2012/0203487 | A1 | * | 8/2012 | Johnson | G01C 25/005 702/141 |
| 2016/0363636 | A1 | * | 12/2016 | Reichenbach | G01R 33/04 |

* cited by examiner

Primary Examiner — Tung X Nguyen
Assistant Examiner — Robert P Alejnikov, Jr.
(74) Attorney, Agent, or Firm — Brian Kolkowski

(57) ABSTRACT

The present invention relates to a sensor suite comprising at least one sensor. More particularly, the present invention relates to a sensor suite for measuring absolute and/or relative position, location and orientation of an object on or in which the sensor suite is employed. The present invention further relates to improved, novel sensor types for use in the sensor suite. More particularly, the present invention relates to an improved, novel magnetometer that is self-calibrating and scalable. Still more particularly, the present invention relates to such a magnetometer that is miniaturized. Further embodiments of the present invention relate to systems and methods for providing location and guidance, and more particularly for providing location and guidance in environments where global position systems (GPS) are unavailable or unreliable (GPS denied and/or degraded environments).

20 Claims, 4 Drawing Sheets

DYNAMIC MAGNETIC VECTOR FLUXGATE MAGNETOMETER AND METHODS OF USING

CROSS-REFERENCE TO RELATED APPLICATIONS

This application is a continuation of U.S. patent application Ser. No. 17/120,731, which was filed on Dec. 14, 2020, and which is a continuation of U.S. patent application Ser. No. 16/357,916, which was filed on Mar. 19, 2019, issued as U.S. Pat. No. 10,895,611 on Jan. 19, 2021, and which claims benefit and priority to U.S. Provisional Patent Application Ser. No. 62/647,207 which was filed on Mar. 23, 2018.

BACKGROUND OF THE INVENTION

1. Field of the Invention

The present invention relates to a sensor suite comprising at least one sensor. More particularly, the present invention relates to a sensor suite for measuring absolute and/or relative position, location and orientation of an object on or in which the sensor suite is employed. The present invention further relates to improved, novel sensor types for use in the sensor suite. More particularly, the present invention relates to an improved, novel magnetometer that is self-calibrating and scalable. Still more particularly, the present invention relates to such a magnetometer that is miniaturized. Further embodiments of the present invention relate to systems and methods for providing location and guidance, and more particularly for providing location and guidance in environments where global position systems (GPS) are unavailable or unreliable (GPS denied and/or degraded environments). The present invention further relates to systems and methods for using inertial measurement units IMUs to provide location and guidance. More particularly, the present invention relates to the use of a series of low-accuracy or low-resolution IMUs, in combination, to provide high-accuracy or high-resolution location and guidance results. The present invention further relates to an electronics-control system for handing off control of the measurement and guidance of a body in flight between groups or subgroups of IMUs to alternate between high dynamic range/lower resolution and lower dynamic range/higher resolution measurement and guidance as the environment dictates.

2. Technical Background

Magnetometers measure magnetism, either the magnetization of a magnetic material like a ferromagnet, or the direction, strength, or relative change of a magnetic field at a particular location. A compass is a simple type of magnetometer, one that measures the direction of an ambient magnetic field. Magnetometers are widely used for measuring the Earth's magnetic field and in geophysical surveys to detect magnetic anomalies of various types. They are also used in the military to detect submarines. Magnetometers can be used as metal detectors: they can detect only magnetic (ferrous) metals, but can detect such metals at a much larger depth than conventional metal detectors; they are capable of detecting large objects, such as cars, at tens of meters, while a metal detector's range is rarely more than 2 meters. In recent years, magnetometers have been miniaturized to the extent that they can be incorporated in integrated circuits at very low cost and are finding increasing use as miniaturized compasses (MEMS magnetic field sensor). There are two basic types of magnetometer measurement. Vector magnetometers measure the vector components of a magnetic field. Total field magnetometers or scalar magnetometers measure the magnitude of the vector magnetic field. Magnetometers used to study the Earth's magnetic field may express the vector components of the field in terms of declination (the angle between the horizontal component of the field vector and magnetic north) and the inclination (the angle between the field vector and the horizontal surface). Absolute magnetometers measure the absolute magnitude or vector magnetic field, using an internal calibration or known physical constants of the magnetic sensor. Relative magnetometers measure magnitude or vector magnetic field relative to a fixed but uncalibrated baseline. Also called variometers, relative magnetometers are used to measure variations in magnetic field. One particular type of magnetometers includes fluxgate magnetometers. A fluxgate magnetometer consists of a small, magnetically susceptible core wrapped by two coils of wire. An alternating electric current is passed through one coil, driving the core through an alternating cycle of magnetic saturation; i.e., magnetized, unmagnetized, inversely magnetized, unmagnetized, magnetized, and so forth. This constantly changing field induces an electric current in the second coil, and this output current is measured by a detector. In a magnetically neutral background, the input and output currents match. However, when the core is exposed to a background field, it is more easily saturated in alignment with that field and less easily saturated in opposition to it. Hence the alternating magnetic field and the induced output current are out of step with the input current. The extent to which this is the case depends on the strength of the background magnetic field. Often, the current in the output coil is integrated, yielding an output analog voltage, proportional to the magnetic field. A wide variety of sensors is currently available and used to measure magnetic fields. Fluxgate compasses and gradiometers measure the direction and magnitude of magnetic fields. Fluxgates are affordable, rugged and compact with miniaturization recently advancing to the point of complete sensor solutions in the form of IC chips, including examples from both academia and industry. This, plus their typically low power consumption makes them ideal for a variety of sensing applications. The typical fluxgate magnetometer consists of a "sense" (secondary) coil surrounding an inner "drive" (primary) coil that is closely wound around a highly permeable core material, such as mu-metal. An alternating current is applied to the drive winding, which drives the core in a continuous repeating cycle of saturation and unsaturation. To an external field, the core is alternately weakly permeable and highly permeable. The core is often a toroidally-wrapped ring (ring-core fluxgate) or a pair of linear elements (rod-core fluxgate) whose drive windings are each wound in opposing directions. Such closed flux paths minimize coupling between the drive and sense windings. In the presence of an external magnetic field, with the core in a highly permeable state, such a field is locally attracted or gated (hence the name fluxgate) through the sense winding. When the core is weakly permeable, the external field is less attracted. This continuous gating of the external field in and out of the sense winding induces a signal in the sense winding, whose principal frequency is twice that of the drive frequency, and whose strength and phase orientation vary directly with the external field magnitude and polarity. There are additional factors that affect the size of the resultant signal. These factors include the number of turns in the sense winding, magnetic permeability of the core, sensor geometry, and the gated flux rate of change with respect to time. Phase synchronous detection is used to extract these harmonic signals from the sense winding and convert them into a DC voltage proportional to the external magnetic field.

Active current feedback may also be employed, such that the sense winding is driven to counteract the external field. In such cases, the feedback current varies linearly with the external magnetic field and is used as the basis for measurement. This helps to counter inherent non-linearity between the applied external field strength and the flux gated through the sense winding. Generally, calibration of magnetometers is usually performed by means of coils which are supplied by an electrical current to create a magnetic field. It allows characterization of the sensitivity of the magnetometer (in terms of V/T). In many applications the homogeneity of the calibration coil is an important feature. For this reason, coils like Helmholtz coils are commonly used either in a single axis or a three axis configuration. For demanding applications high homogeneity magnetic field is mandatory, in such cases magnetic field calibration can be performed using Maxwell coil, cosine coils or calibration in the highly homogenous Earth's magnetic field. Fluxgate magnetometers capable of self-calibration have been developed, but are very large due to the requirements of the coils and calibration coils, and only calibrate in a single principle axis.

Precision guided munitions (PGM) are becoming an increasingly desired capability by the warfighter, from squad level through brigades. Historically, missile guidance technologies have migrated and transitioned to munition applications but with significant challenges. To date, these problems have included both technology limitations when applied to gun launch environments as well as prohibitive cost of implementation. Several research development test and evaluate (RDT&E) efforts are ongoing to enable affordable precision guidance to munitions, and several precision guided munitions have been fielded. Global Position Systems (GPS) has been a primary technology for Guidance Navigation and Control (GNC). Together with an Inertial Measurement Unit (IMU) munitions are able to precisely strike targets while reducing collateral damage. PGMs have typically been larger caliber projectiles mainly due to Size, Weight, Power and Cost (SWaP+C) constraints when attempting to miniaturize the guidance subsystems. Another challenge that has become an increased threat is jamming technologies, which can degrade or deny GPS. Jamming the GPS information will minimize the effect of PGMs and reduce the capability of the warfighter in the future.

Tactical grade IMUs with high performance accelerometers and gyroscopes allow for a robust navigation solution when the GPS signal is degraded. However, various technical obstacles must be overcome in order to utilize affordable, tactical grade IMUs in the PGM environments, including mortar and artillery. For example, the tactical grade IMU packages are currently large, expensive and do not have high enough dynamic range to be used in the most demanding munition environments. Additionally, gun launch environments include high g shock, vibration and rotational accelerations that can cause degradation in performance or complete failure of the sensors within the IMU. In launch environments of 17,500 g+ and spin environments of 300 Hz (typical of artillery), the accelerometer and gyroscope sensors can have significant changes in their bias stability, offsets and random walk parameters.

Therefore, it is an object of the present invention to provide an improved magnetometer, preferably a fluxgate magnetometer that is scalable, particularly in the direction of miniaturization, and is adapted to be capable of self-calibration, in a completely spherical direction, not just a single principle axis. It is a further object of the present invention to provide precision guidance capabilities in GPS denied and/or degraded environments. It is a further object to provide such guidance in a more cost-effective manner, as well as in smaller form factors, including miniaturized, in order to increase the range of applications and ease of use.

SUMMARY OF THE INVENTION

The present invention includes a miniature multi-IMU package that can meet or exceed the performance of tactical or navigational guidance after/while operating in a high g and high spin launch environment and in GPS denied and/or degraded environments. The guidance system of the present invention is largely focused on a sensor suite consisting of multiple accelerometers, gyroscopes and optionally magnetometers that fit within a small or miniaturized form factor, for example a 1.5 cubic inch package, or preferably smaller. The sensor suite is preferably packaged to survive gun launch environments and to exhibit survivability up to or greater than 20,000 g in the field. Examples of munitions or form factors for which the present invention may be used for the high spin environment include, but are not limited to, 155 mm artillery and mortars, 40 mm artillery and mortars, and the like. One distinct advantage of the present invention is the packaging of multiple IMUs within a single package, housing or body. The present invention further employs a sensor fusion algorithm that uses all available sensor data, and with this fusion algorithm the sensor suite is able to create a single high performance IMU that performs as if a single tactical or even navigational grade device using only low-cost, or even ultra-low-cost IMUs, or a combination of low- and mid-range IMUs that individually have much lower accuracy and resolution, using a statistical fusion that increases the measurement performance that is provided as output to other GNC systems or subsystems. More specifically, in one preferred embodiment, the present invention utilizes multiple low-accuracy or low-resolution IMUS in combination with at least one mid- or even high-accuracy or mid- or high-resolution IMUs, and combines them within a single structural framework, in order to create a single sensor-fused IMU unit that operates with highly accurate (such as tactical or navigation grade) location and guidance.

The present invention provides great benefit for many industries, arenas and technologies, and is not limited to the defense and munition-related embodiments disclosed throughout. For example, the present invention is envisioned for use in the automotive industry. More particularly, the present invention may be utilized for automotive navigation in general, but also for autonomous vehicle navigation. The highly accurate and sensitive position, location, guidance and navigation capabilities of the multi-IMU systems and methods disclosed herein can be used to supplement and augment GPS systems for more accurate navigation and location purposes. The multi-IMU systems and methods can be of particular use in navigationally-complex locations such as large cities where GPS signals may be attenuated or subject to interference, or remote locations without accurate coverage. Further, the systems and methods disclosed herein are not hindered by other structures such as tunnels or bridges which tend to block GPS signals and lead to broken and inaccurate coverage. Such accuracy and utility in the GPS denied and/or degraded environments are even more useful in the autonomous vehicle market. Human-piloted vehicles, even in GPS denied and/or degraded environments, have a human user capable of making decisions without assistance from GPS. Autonomous vehicles do not necessarily have such a contingency option, and are at the mercy of sensor signals and algorithms to determine the course of the vehicle. The multi-IMU systems and methods of the present invention allow autonomous vehicles to operate with enhanced-accuracy signals that are not hampered by interrupted or spotty GPS signals, or the complete absence thereof. The Multi-IMU systems and methods of the present invention provide precise location and guidance information to the vehicles such that the vehicle can more accurately and safely operate autonomously, even in GPS denied and/or degraded environments. Similarly, public transportation is another industry which benefits from the use of the multi-IMU systems and methods of the present invention. Non-GPS reliant location and navigation allows for tracking of public transportation vehicles and for safer and more accurate navigation thereof. Efficiency may be increased by monitoring the location of public transportation vehicles and routing of vehicles to high demand locations. Also, users of the public transportation may monitor and track the location of their intended transportation vehicle and can make sure to arrive at pickup locations at appropriate times. This enhances the efficiency of both the public transportation system as well as the individual users who may not need to wait for extended periods of time in anticipation of the vehicle's arrival. Such transportation systems clearly benefit from the ability to track location and provide navigation based on the likelihood of interrupted GPS signals that often plagues the operating theaters of such vehicles.

Another industry that may benefit from the present invention is for tracking the location of first responders, military personnel, and the like. Often, first responders and military personnel are called upon to enter dangerous environments in an attempt to save others. These environments are often tumultuous and difficult to navigate. The multi-IMU systems and methods of the present invention allow for a multi-IMU system to be placed on the body or in the gear of such an individual and for that individual's location to be tracked with high accuracy and specificity. When this location is monitored and tracked by a remote system or user, the first responders location can be monitored at all times. In such embodiments, preferably the multi-IMU sensor data is telemetered back to a response vehicle or other communication system or unit. Thus, in the event of dangerous or catastrophic events that prevent the first responder from escaping the situation himself or herself, is or her location is known and rescue can be sent to the first responder's precise location. Further, as the first responder is navigating through the situation, he or she may report any additional details back to the remote system or user which allows for continuous updates of conditions with precise accuracy of location. Thus, not only is the original responder's safety increased, but also that of all other responders and personnel called upon to enter the situation. The multi-IMU systems and methods of the present invention may also be used to provide guidance and navigation to such first responders and military personnel by coordinating their location with maps, floor plans or other sources of information regarding the particular location in which they are engaged. Thus, for example, a firefighter may enter a burning building and be guided through the building, even in low-visibility, and if he or she becomes trapped or lost, then can be guided through an alternative route or a rescuer may be sent to the responder's exact known location to recover him or her.

The multi-IMU systems and methods of the present invention are also envisioned for use in personal electronics, particularly cellular and smart phones. In such embodiments, a miniaturized multi-IMU system may employ multiple IMUS embedded onto one or more application specific integrated circuits (ASIC) and employed within the phone or other electronic device. Such systems may be used in any event where precise and accurate location and/or navigation is required using the electronic device. Personal navigation may be supplemented or augmented for circumstances where GPS is denied and/or degraded. Also, device location may be easier for instances where the user has lost his or her phone or other electronic device.

Various embodiments of the IMU sensor suite preferably include multiple sensor devices that are integrated together through a microcontroller to perform processing in order to supply output data at acceptable format/rate/range/resolution. These acceptable specifications or requirements may vary based on the application, but for most preferred embodiments, the goal is to achieve at least tactical grade navigation and or guidance, and more preferably navigation grade. Exemplary tactical grade navigation or guidance exhibits an angular random walk (ARW) of about $0.002°/\sqrt{hour}$. Exemplary navigation grade navigation or guidance exhibits an ARW of about $0.07°/\sqrt{hour}$. In order to meet dynamic range requirements for PGMs (potentially +/− 40 g accelerometer, 300 Hz spin); various embodiments of the present invention preferably employ the spatially orientated IMUs around the circumference of its electronic boards within the multi-IMU package. These sensors (preferably at least accelerometers) provide measurement data that can be used to attain angular acceleration and ultimately angular motion estimates. For example, consider an object moving in a circle of radius r with constant angular velocity. The tangential speed is constant, but the direction of the tangential velocity vector changes as the object rotates. Multiple accelerometers at different radii can be used to separate linear acceleration from centripetal acceleration and solve for rotational speed using a processor. Some embodiments preferably include sensors comprising accelerometers and gyroscopes. Depending on the environment and conditions, the low-end gyroscopes may become saturated and unable to provide accurate measurements. Some embodiments enable the system to use the gyroscopes when the rotational speed is within their range of measurement and use the accelerometers when the rotational speed is beyond the range of the gyroscopes. Some embodiments of the multiple IMU sensor suite may include a magnetometer as part of at least some of the individual low-end IMUs. The increased number of IMUs within the present invention provides increased measurement performance as well as the ability to isolate failures or offsets in sensors. Effectively, each individual IMU provides a redundant measurement which allows for calibration, error correction and enhanced accuracy. The configuration of the IMUs of the present invention employs an innovative parallel communication strategy that enables the microcontroller to collect and process data efficiently in order to meet internal and external deadlines associated with commands necessary for the PGM navigation. A parallel data bus may be employed in various embodiments and is used to provide identical communication between several IMUs and the microcontroller. A common clock enables data communication to be processed in parallel in the firmware through bit banging, reading the whole I/O port and all IMU data on the bus. Simple matrix manipulation allows for the bit matrix to be delivered to sensor fusion algorithms in the correct format.

The advantages of the design of the multi-IMU sensor suite of the present invention include the ability to reject stochastic errors within the architecture. Averaging the measurement across all IMU devices gives:

Equation 1:

$$s_k = \sum_i \frac{1}{N} s_k^{-i} = s_k^i \sum_i \frac{1}{N} v_k^i \qquad \text{Equation 1}$$

Using this mean along with the variance of the estimate, s, allows for reduction of the sensor error noise. Using an adaptive weight on each sensor based on a voting scheme, the IMU gains can be manipulated to continue to reduce the measurement errors, without incurring latency penalties. Another benefit of the multi-IMU prototype is the ability to reject and isolate failed sensors. If an IMU or component with an IMU fails, this failure can be detected and isolated/rejected from inclusion in the ultimate navigation solution.

The data redundancy provided by measurement from each of the individual IMUs can also be exploited by leveraging the similarity of each IMU, preferably while also taking into account any differences between them, such a based on relative and absolute position of each IMU on the multi-IMU system. By placing the IMUs at different rotations, drifts in measure due to time and temperature tend to cancel when the measurements of separate IMUs are combined. The IMUs that are part of the multi-IMU preferably have configurable dynamic ranges and resolutions. Additionally, the multi-IMU may have, in some embodiments, IMUs with different configurations to give a more robust measurement package. By having different dynamic ranges, the multi-IMU is able to measure over extended flight conditions without increased noise in the package. The redundancy is also beneficial to allow the multi-IMU to provide spatial and temporal diversity. By distributing the IMUs on both sides of the board and around the printed circuit board (PCB), different sensors can be used to gather high resolution data while at extreme flight conditions. A key case for the redundant measurement is that of high spin: the gyroscopes can be situated and configured to give high resolution data at lower spin rates, while accelerometers placed intelligently around the edge of the PCB will provide rotational measurement at very high spin rates (300 Hz+ depending on placement).

Temporal diversity within the scope of the present invention pertains to the ability of the multi-IMU to configure and communicate with individual IMUs and enhance the data output. For example, the multi-IMU is be able to sample data asynchronously, and use the microcontroller and advanced timers to fuse the data and provide an effective sampling rate that is much higher than the specified rate of each individual sensor. Through the multi-IMU firmware, the overall sensor suite is capable of weighting the correct sensor as the mission/flight dictates. When maneuvers and/or rocket subsystems engage or actuate, the electronics are able to provide the handshake between high-range sensors and low-range sensors so that the system can accurately capture the motion of the projectile in order to maintain accurate navigation solutions. This redundancy in sensor(s) also serves two other beneficial purposes. First, significant increase in precision with the customized higher grade IMU but in a reduced sensor range (+/−16 G, 2,000 dps) can be achieved. The firmware is designed to adaptively switch between the higher grade IMU and the multiple low cost IMUs at the onset of saturation of each of the sensor's dynamic range. Second, this redundancy allows for an overdetermined system when used to estimate the state/orientation of the projectile. The outputs provided by the additional sensors are always available for the enhanced Kalman Filter (EKF) so that a robust, consistent solution will exist based on sensor suite outputs. As the main GNC suite, the present invention leverages a customized package of the higher grade IMU and multiple lower cost IMUs to reduce footprint, increase capabilities and meet the volumetric constraints of the projectile(s) to be cross-platform compatible.

A high-level description of the packaging for one embodiment of the IMU-based components of multi-IMU is provided in Table 1. Tables 2 through 7 below provide performance estimates for each of the individual sensors within the higher grade IMU (Gyro in Table 2, Accelerometer in Table 3, Magnetometer in Table 4, Roll-Gyros in Table 5, lower cost IMU-MPU9250 AD-Accelerometers in Table 6, and Shock-Accelerometer in Table 7) within various exemplary embodiments of the present invention's multi-IMU after a calibration routine is applied.

TABLE 1

High-level characteristics of multi-IMU

| Characteristic | Value |
|---|---|
| Vendor | VectorNav (VN-100x), FXAS21002, AD22285, 3501A2060KG |
| Diameter (mm) | 35 |
| Height (mm) | 18 |
| Voltage (VDC) | 5 |
| Current (A) | 0.150 |
| Mass (g) | <40 |
| Output Data Rate(s) (Hz) | 2,000+ (15 kHz Shock Accel) |
| Activation Time (s) | 0.15 |
| Sensor Start Time (s) | 0.05 |
| Measurement Latency (s) | <1.3 msec |

TABLE 2

Performance Estimate for VN-100-Gyro

| Parameter | Estimated Performance |
|---|---|
| Bandwidth (Hz @ Phase <90 deg) | 256 |
| Scale Factor-X/Y/Z (ppm) | 250 |
| Scale Factor Asymmetry (ppm) | 250 |
| G Sensitive Bias (deg/hr/G) | 30 |
| Misalignment (mrad) | 0.87 |
| Non-Orthogonality (mrad) | 0.1 |
| Bias Stability-min 60 s (deg/hr) | <10 |
| ARW-X/Y/Z (deg/√hr) | 0.8 |
| Output Noise-RMS (100 Hz BW) (deg/s) | 0.035 |
| VRE-X/Y/Z (deg/hr/Grms) | 30/30/30 |
| Operating Rate-X/Y/Z (deg/s) | 2,000/2,000/2,000 |

TABLE 3

Performance Estimate for VN-100-Accelerometer

| Parameter | Estimated Performance |
|---|---|
| Bandwidth (Hz @ Phase <90 deg) | 260 |
| Scale Factor (ppm) | 250 |
| Scale Factor Asymmetry (ppm) | 250 |
| Misalignment (mrad) | 0.87 |
| Non-Orthogonality (mrad) | 0.1 |
| Bias Stability-min 60 s (mG) | 0.4 |
| VRW-X/Y/Z (deg/hr/Grms) | 0.6 |
| Output Noise (RMS (100 Hz BW) | 0.14 |
| VRE (mG/G$^2$) | <0.5 |
| Operating Accel. (G) | 16 |

TABLE 4

Estimated Performance for VN-100-Mag

| Parameter | Estimated Performance |
|---|---|
| Bandwidth (Hz @ Phase <90 deg) | 200 |
| Bias-(mGauss) | 10 |
| Scale Factor Error (ppm) | 700 |
| Misalignment (mrad) | 0.14 |
| Non-Orthogonality (mrad) | <0.5 |
| Noise-RMS (Gauss) | 1.9 |
| Magnetic Range (Gauss) | 2.5 |

TABLE 5

Estimated Performance for FXAS21002 Roll-Gyro

| Parameter | Estimated Performance |
|---|---|
| Bandwidth (Hz @ Phase <90 deg) | 256 |
| Scale Factor-X/Y/Z (ppm) | 2200 |
| Scale Factor Asymmetry (ppm) | 2,000 |
| G Sensitive Bias (deg/hr/G) | 50 |
| Misalignment (mrad) | 1.5 |
| Non-Orthogonality (mrad) | 1.0 |
| Bias Stability-min 60 s (deg/hr) | 40 |
| ARW-X/Y/Z (deg/√hr) | 3.75 |
| Output Noise-RMS (100 Hz BW) (deg/s) | 0.05 |
| VRE-X/Y/Z (deg/hr/Grms) | 50 |
| Operating Rate-X/Y/Z (deg/s) | 4,000 |

TABLE 6

Estimated Performance for AD22285-Accel

| Parameter | Estimated Performance |
|---|---|
| Bandwidth (Hz @ Phase <90 deg) | 400 |
| Scale Factor (ppm) | 2,000 |
| Scale Factor Asymmetry (ppm) | 1,000 |
| Misalignment (mrad) | 1.47 |
| Non-Orthogonality (mrad) | 0.7 |
| Bias Stability-min 60 s (mG) | 0.4 |
| VRW-X/Y/Z (deg/hr/Grms) | 0.6 |
| Output Noise (RMS (100 Hz BW) | 1.4 |
| VRE (mG/G$^2$) | 0.5 |
| Operating Accel. (G) | 55 |

TABLE 7

Estimated Performance 3501A2060KG Shock Accelerometer

| Parameter | Estimated Performance |
|---|---|
| Measurement Range (G) | ±0 to 60,000 |
| Frequency Range (±1 dB) | 20 kHz |
| Overload limit (Shock) | 100,000 g pk |
| Sensitivity | 0.0003 mV/V/g |

The components comprising the sensor suite for the multi-IMU have been evaluated using modeling, simulation and analysis (MS&A) tools as well as preliminary testing on parallel efforts to evaluate the accuracy of the prototype design. The present invention further includes a calibration routine for the sensor suite electronics package that compensates for the errors present in all IMU devices. Table 8 shows the performance estimate for the multi-IMU sensor suite (not shock accelerometer). The compensation routines developed in conjunction with the sensor suites of the present invention help ensure that the IMUs are useable in gun-launched applications. The calibration methodology includes compensation for coning, sculling and size effects of the IMU as well as the high-g offsets, polarity-error and drift that can be seen in various sensors when subjected to high-g and high-vibration gun launch.

TABLE 8

Accuracy errors for sensor suite of the multi-IMU

| Category | Option-Tier-2 (CGSS) |
|---|---|
| Gyroscope Rate Range (dps) | X = +/−20,000 Y/Z = +/−2,000 |
| Accelerometer Range min (G) | X/Y/Z = +/−16 |
| Accel/Gyro Bandwidth min (Hz) | Accel = 260, Gyro = 256 |
| Measurement Latency | ~1.25 ms |
| Gyro Bias Instability/Noise Floor (dph) | 5 |
| Gyro Bias Stability (dph) | <10 |
| Gyro ARW (deg/s/rthr) | 0.8 |
| Gyro Noise RMS, 100 Hz BW (dps) | 0.05 |
| Gyro SF Error (ppm) | 250 |
| Gyro SF Asym Error (ppm) | 250 |
| Gyro Misalignment (mrad) | 0.87 |
| Gyro Non-Orthog (mrad) | <0.01 |
| Gyro G Sens Bias (deg/hr/G) | ~3 |
| Gyro VRE (deg/hr./Grms) | 150 |
| Accel Bias Instability/Noise Floor (mG) | 0.005 |
| Accel Bias Stability (mG) | <0.04 |
| Accel VRW (mG) | 0.06 |
| Accel Noise RMS, 100 Hz BW | |
| Accel SF Error (ppm) | 250 |
| Accel SF Asym Error (ppm) | 250 |
| Accel Misalignment (mrad) | 0.87 |
| Accel Non-Orthog (mrad) | <0.01 |
| Accel VRE (mG/Grms) | 50 mg/g$^2$ |
| Mag Range (Gauss) | +/−2.5 |
| Mag Bandwidth min (Hz) | 200 |
| Mag Bias (nTesla) | 0.01 |
| Mag SF Error (ppm) | <0.1% |
| Mag Misalignment (mrad) | 0.87 |
| Mag Non-Orthog (mrad) | <0.01 |

Further, various embodiments of the present invention preferably include a handshake feature whereby various groups or subgroups of individual IMUs are utilized at different times or under different conditions, and the system provides a handshake command such that one group or subgroup of IMUs hands off monitoring and measurement functions to a different group of subgroup of IMUs. Such feature enables the system to use a configuration of sensors that provides a large dynamic range with a lower level of resolution when conditions are best served by such sensors, and for the system to switch to a configuration of higher resolution sensors with a lower dynamic range when such a configuration would benefit the system's operation. For example, in a guided projectile that is in the midst of a long-range path of travel that requires little maneuvering, an individual IMU, group, or subgroup of IMUs can be used that exhibits large dynamic range with lower resolution because the projectile requires little instruction in the way of maneuvering commands. However, as such projectile approaches its target, which may very well be a moving target, the system preferably switches to an individual IMU, group or subgroup of IMUs that exhibit higher resolution with a lower dynamic range, where the higher resolution gives the projectile more accurate and rapid control of sudden and precise maneuvers and movements. Many combinations of IMUS, groups and subgroups of IMUs can be envisioned, and reincorporated within the scope of the invention, by way of non-limiting example, IMU groupings covering particular flight conditions that are known to be particularly useful for flight of a particular system, IMU groupings where adjacent ranges of conditions are pre-defined and measured by each group of IMUs, overlapping ranges of conditions whereby each grouping of IMUs is used in a particular range of conditions where the ranges overlap and redundancy is provided by measuring with multiple groups of IMUs, or combinations of the above.

Several different embodiments of the invention are envisioned. Some embodiments comprise a guidance system while others involve methods of providing guidance and/or location, with all embodiments providing a sum result that is a more accurate and high-resolution location, guidance and navigation result than the component parts are individually capable of, and at least as accurate as high-end, expensive solutions on the market today.

One embodiment of the present invention includes a guidance system adapted for accurately providing location and guidance in a global positioning system (GPS) denied and/or degraded environment, the system comprising: at least one electronics board comprising an upper surface, a lower surface and a plurality of inertial measurement units (IMUs) mounted on at least one of the surfaces, each IMU having a signal and comprising at least one three-axis accelerometer and/or at least one three-axis gyroscope, the IMUs adapted to be coupled together via firmware; a processor adapted to receive the signal from each IMU; and an algorithm comprised in the processor, the algorithm adapted to synchronize the signals from each of the IMUs, calculate a bias and a drift in the signal of each IMU, and to provide a guidance metric representative of the absolute or relative location of a munition guided by the guidance system and based on the signals of each of the IMUs.

Another embodiment of the present invention includes a guidance system adapted for accurately providing location and guidance in a global positioning system (GPS) denied and/or degraded environment, the system comprising: at least one electronics board comprising an upper surface, a lower surface and a plurality of inertial measurement units (IMUs) mounted on at least one of the surfaces, each IMU having a signal and comprising at least one three-axis accelerometer and/or at least one three-axis gyroscope, the IMUs adapted to be coupled together via firmware; a processor adapted to receive the signal from each IMU; and an algorithm comprised in the processor, the algorithm adapted to synchronize the signals from each of the IMUs, calculate a bias and a drift in the signal of each IMU, and to provide a guidance metric representative of the absolute or relative location of a munition guided by the guidance system and based on the signals of each of the IMUs, wherein the guidance system exhibits an angular random walk less than or equal to $0.09°/\sqrt{hour}$.

Yet another embodiment of the present invention includes a guidance system adapted for accurately providing location and guidance in a global positioning system (GPS) denied and/or degraded environment, the system comprising: at least one electronics board comprising an upper surface, a lower surface and at least four inertial measurement units (IMUs) mounted on at least one of the surfaces, each IMU having a signal and comprising at least one three-axis accelerometer and/or at least one three-axis gyroscope, the IMUs adapted to be coupled together via firmware; a processor adapted to receive the signal from each IMU; and an algorithm comprised in the processor, the algorithm adapted to synchronize the signals from each of the IMUs, calculate a bias and a drift in the signal of each IMU, and to provide a guidance metric representative of the absolute or relative location of a munition guided by the guidance system and based on the signals of each of the IMUs, wherein the guidance system exhibits an angular random walk less than or equal to $0.09°/\sqrt{hour}$.

Still another embodiment of the present invention includes a guidance system adapted for accurately providing location and guidance in a global positioning system (GPS) denied and/or degraded environment, the system comprising: at least one electronics board comprising an upper surface, a lower surface, each surface being divided into quadrants, and at least sixteen inertial measurement units (IMUs) mounted on at least one of the surfaces in groups of four IMUs per quadrant, each IMU having a signal and comprising at least one three-axis accelerometer and/or at least one three-axis gyroscope, the IMUs adapted to be coupled together via firmware a processor adapted to receive the signal from each IMU; and an algorithm comprised in the processor, the algorithm adapted to synchronize the signals from each of the IMUs, calculate a bias and a drift in the signal of each IMU, and to provide a guidance metric representative of the absolute or relative location of a munition guided by the guidance system and based on the signals of each of the IMUs, wherein the guidance system exhibits an angular random walk less than or equal to $0.09°/\sqrt{hour}$.

Even another embodiment of the present invention includes a guidance system adapted for accurately providing location and guidance in a global positioning system (GPS) denied and/or degraded environment, the system comprising: at least one electronics board comprising an upper surface, a lower surface and a plurality of inertial measurement units (IMUs) mounted on at least one of the surfaces, each IMU having a signal and comprising at least one three-axis accelerometer and/or at least one three-axis gyroscope, the IMUs adapted to be coupled together via firmware; a processor adapted to receive the signal from each IMU; and an algorithm comprised in the processor, the algorithm adapted to synchronize the signals from each of the IMUs, calculate a bias and a drift in the signal of each IMU, and to provide a guidance metric representative of the absolute or relative location of a munition guided by the guidance system and based on the signals of each of the IMUs, wherein a plurality of the individual IMUs has an angular random walk (ARW) greater than $0.2°/\sqrt{hour}$ or greater, but the guidance system as a whole exhibits an angular random walk less than about ¼ the ARW of any individual IMU.

Still yet another embodiment of the present invention includes a projectile or vehicle with a guidance measurement and control system comprising: at least one electronics board mounted interiorly to the projectile or vehicle body, the electronics board comprising an upper surface, a lower surface and a plurality of inertial measurement units (IMUs) mounted on at least one of the surfaces, each IMU having a signal and comprising at least one three-axis accelerometer and/or at least one three-axis gyroscope, the IMUs adapted to be interconnected at least via firmware, the IMUs electrically separated into at least two separate groups, at least one group adapted to have a high dynamic range of measurement with lower resolution and at least one group adapted to have a low dynamic range of measurement with higher resolution; a processor adapted to receive the signal from each IMU; a guidance algorithm comprised in the processor, the guidance algorithm adapted to synchronize the signals from each of the IMUs, calculate a bias and a drift in the signal of each IMU, and to provide a guidance metric representative of an absolute or relative location of the projectile or vehicle based on the signals of each of the IMUs; a handshake algorithm comprised in the processor, the handshake algorithm adapted to select one of the at least two separate groups of IMUs based on the projectile's or vehicles spin rate or acceleration; and an actuator adapted to adjust a control system to adjust a course of the projectile or vehicle based at least in part on the guidance metric.

Yet even another embodiment of the present invention includes an artillery round with a guidance measurement and control system comprising: at least one electronics board mounted interiorly to the artillery round, the electronics board comprising an upper surface, a lower surface and a plurality of inertial measurement units (IMUs) mounted on at least one of the surfaces, each IMU having a signal and comprising at least one three-axis accelerometer and/or at least one three-axis gyroscope, the IMUs adapted to be interconnected at least via firmware, the IMUs electrically separated into at least three separate spin rate measurement groups, and at least two separate acceleration measurement groups; a processor adapted to receive the signal from each IMU; a guidance algorithm comprised in the processor, the guidance algorithm adapted to synchronize the signals from each of the IMUs, calculate a bias and a drift in the signal of each IMU, and to provide a guidance metric representative of an absolute or relative location of the artillery round based on the signals of each of the IMUs; a handshake algorithm comprised in the processor, the handshake algorithm adapted to select one of the at least two separate groups of IMUs based on the projectile's or vehicles spin rate or acceleration; and an actuator adapted to adjust a control system to adjust a course of the projectile or vehicle based at least in part on the guidance metric.

Even still yet another embodiment of the present invention includes a munition round with a guidance measurement and control system comprising: at least one electronics board mounted interiorly to the munition round, the electronics board comprising an upper surface, a lower surface and a plurality of inertial measurement units (IMUs) mounted on at least one of the surfaces, each IMU having a signal and comprising at least one three-axis accelerometer and/or at least one three-axis gyroscope, the IMUs adapted to be interconnected at least via firmware, the IMUs electrically separated into at least two separate spin rate measurement groups, and at least three separate acceleration measurement groups; a processor adapted to receive the signal from each IMU; a guidance algorithm comprised in the processor, the guidance algorithm adapted to synchronize the signals from each of the IMUs, calculate a bias and a drift in the signal of each IMU, and to provide a guidance metric representative of an absolute or relative location of the munition round based on the signals of each of the IMUs; a handshake algorithm comprised in the processor, the handshake algorithm adapted to select one of the at least two separate groups of IMUs based on the projectile's or vehicles spin rate or acceleration; and an actuator adapted to adjust a control system to adjust a course of the projectile or vehicle based at least in part on the guidance metric.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention. They are not, however, intended to be limiting or to illustrate all envisioned embodiments.

DETAILED DESCRIPTION OF THE INVENTION AND DRAWINGS

Figure 1:
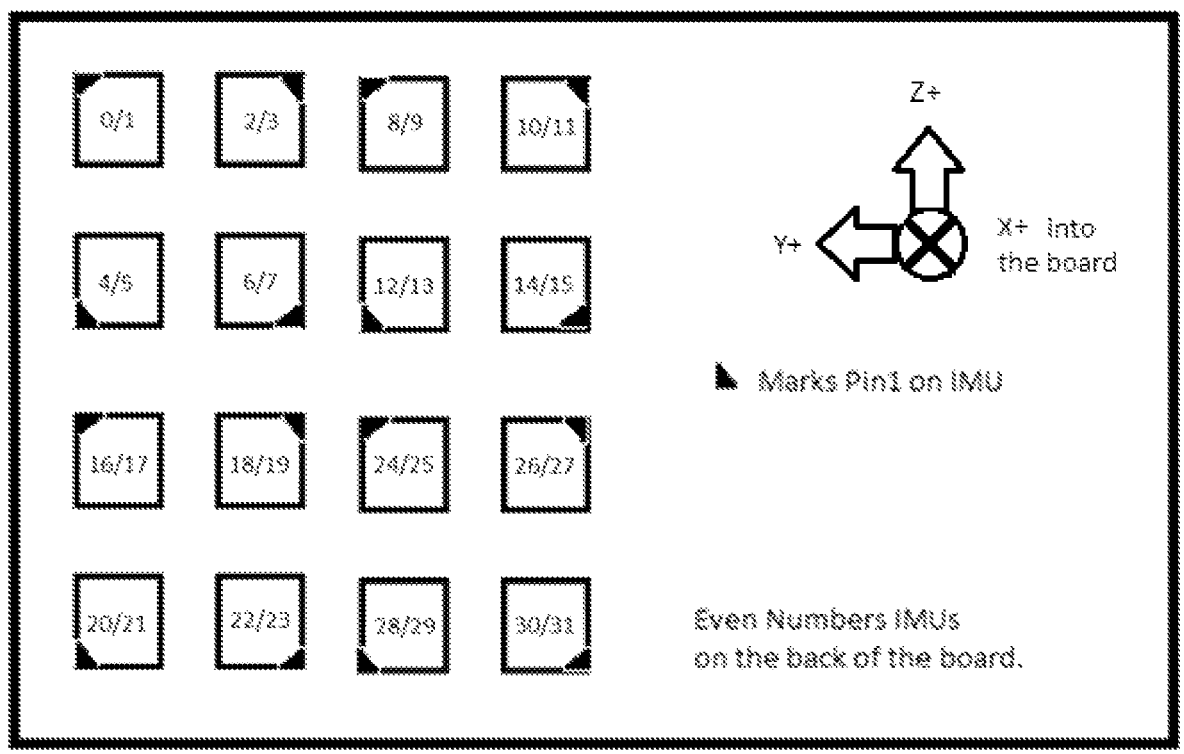
FIG. 1. Schematic diagram depicting one embodiment of the invention with multiple IMUs configured on a single printed circuit board.

The present invention relates to systems and methods for providing location and guidance, and more particularly for providing location and guidance in environments where global position systems (GPS) are unavailable or unreliable (GPS denied or degraded environments). The present invention further relates to systems and methods for using inertial measurement units IMUs to provide location and guidance. More particularly, the present invention relates to the use of a series of low-accuracy or low-resolution IMUs, in combination, to provide high-accuracy or high-resolution location and guidance results.

The present invention further utilizes an IMU comprising a sensor suite of preferably several sensors used to provide measurements including, but not limited to, body rates, linear accelerations and magnetic disturbance data measurements useful for providing precise navigation and control of munitions, missiles, projectiles, vehicles, or the like, or precise location and guidance to individuals. The individual IMUs or multi-IMU of the present invention may be used as a standalone IMU, or can be integrated into a guidance electronic unit (GEU)/IMU to be utilized with various systems and devices. Each individual low-end IMU preferably comprises one or more sensors in various combinations, such sensors including, but not limited to accelerometers, gyroscopes, magnetometers, GPS sensors and separate integrated sensor suites. Further, the systems of the present invention utilize a range of sensors for maneuvering or stabilizing the round or vehicle during travel, or the individual. The sensors, for example, may be used to determine the round's, vehicle's or individual's relative position with respect to a moving target or target location, flow dynamics on a flow surface of a round or vehicle, and threats or obstacles in or around the round, vehicle or individual. The sensors for determining the relative position may include but are not limited to antennas for acquiring global positioning (GPS as mentioned above), magnetic sensors, solar detectors, and the like. The sensors for determining flow dynamics may include but are not limited to a static and/or dynamic pressure sensor, shear stress sensor (hot film anemometer, a direct measurement floating-element shear stress sensor), inertial measurement unit or system, and other sensors known to those skilled in the art whose signal could be used to estimate or determine flow condition such as separation on the surface of the round or vehicle, which would function as a trigger point for actuating a control system. The sensors for determining threats or obstacles in or around the round, vehicle or individual include but are not limited to radar detectors, laser detectors, chemical detectors, heat (or infrared) detectors, and the like. The sensors most useful for determining travel parameters of a round, vehicle or individual include accelerometers, magnetometers, IR sensors, rate gyros, and motor controller sensors.

An important development of the present invention is a self-calibrating fluxgate magnetometer that is adapted for self-calibration in all directions and axes, not just a single principle axis. Its novelty lies in its ability to continuously calibrate itself, more specifically every measurement it takes is fully spatially calibrated. With traditional fluxgate magnetometers, each sensor axis has a tightly controlled magnetic vector so that measurements in each axis can be taken. The present invention, instead, dynamically creates and controls the magnetic vector allowing for the collection of an entire spheroid or "cloud" of measurements. This cloud will have a local minimum and a local maximum that when connected with a vector, coincides with the local earth magnetic field. This "cloud" of measurements can shrink and grow with temperature changes and metal offsets, but the min to max vector remains present in the data. In order to collect all the points required for each cloud of points, the magnetic vectors must be rapidly formed and maneuvered through the core material in the sensor. The present invention preferably benefits from utilizing low coercivity magnetic materials and/or high performance commercial materials like Mumetal™. In addition to such core materials, the present invention utilizes magnetic vector generation methods and algorithms to enable reliable clouds of data to be captured. Finally several approaches to minimally computationally intensive earth vector extraction techniques complete the differentiating characteristics of the Dynamic Magnetic Vector Fluxgate Magnetometer.

A sensor system comprising of a fluxgate magnetometer sensor and requisite drive and sensing electronics enables this new magnetic sensing capability. First the fluxgate magnetometer of the present invention has three mutually orthogonal coils (or coil sets) surrounding a ferromagnetic core. The ferromagnetic core can be ferrite, certain steels, or other high magnetic permeability materials such as mu-metal. A $4^{th}$ coil may optionally enclose the fluxgate magnetometer for embodiments in which it is desired to make measurements on vectors outside the principal planes of the sensor. In embodiments where the $4^{th}$ coil is not used, any of the 3 coils is used as the pickup coil for any planar vector created by a mix of the other two coils. The drive electronics comprise two key components: 1) the function generator adapted to set the pace of the alternating effect of the magnetic field in the ferromagnetic material; and 2) the vector generation module adapted to determine along which vector the next measurement will be taken. The function generator generates the waveform and rate (frequency) of the overall drive signal. Preferably, the drive signal frequency is between 5 kHz and 500 kHz. More preferably, the drive signal frequency is between 6 kHz and 450 kHz. Still more preferably, the drive signal frequency is between 7 kHz and 400 kHz. Yet more preferably, the drive signal frequency is between 8 kHz and 350 kHz. Even more preferably, the drive signal frequency is between 9 kHz and 300 kHz. Still even more preferably, the drive signal frequency is between 10 kHz and 250 kHz. The vector generation module sets the pattern that will sweep through the sensor to pick up measurements. On the sensing electronics side, the variances in the signal coming into the pickup coil (either the $3^{rd}$ or $4^{th}$ depending on the specific architecture and embodiment) are captured and stored for analysis. These elements describe the conceptual architecture that all embodiments of the improved self-calibrating magnetometer will utilize.

The vector generation module is directed, at least in part, to determining the pattern in which the calibration spheroid is generated. The calibration spheroid is generated as a function of a series of measurement coils or vectors being created by providing power to one or more drive coils. Providing power to the drive coils electrically generates a measurement vector or coil that is located between or among the drive coils, particularly when one or more of the drive coils or pairs of drive coils are powered simultaneously. For example, if the drive coils are labeled as the x, y, and z axes of the magnetometer, where a pair of drive coils is positioned at each end of the magnetometer along each axes (i.e., x axis drive coils at positions x and −x, y axis drive coils at positions y and −y, and z axis drive coils at positions z and −z), then providing power to one or more of the individual drive coils will create a measurement vector or coil within the magnetometer that can be sensed and measured by the magnetometer as a measure of the magnetic field along that measurement vector or coil. Powering the x drive coil will create a measurement coil or vector along the positive x axis; powering the −x drive coil will create a measurement coil or vector along the −x axis; and powering both the x and −x drive coils will create a measurement vector substantially 90 degrees from the axis formed between the x and −x drive coils. Providing power to the x drive coil and the −z drive coil will create a measurement vector or coil that is shifted off of the principal axes based on the amount of power supplied to each drive coil. Thus, by supplying power to one or more drive coils, a measurement vector or coil is generated relative to the drive coils, and changing position as a function of the drive coils that are powered and the amount of power provided to each drive coil. In this fashion, the vector generation module can determine the pattern in which the measurement vectors or coils may be generated in order to generate the calibration spheroid substantially surrounding the core of the magnetometer with measurement vectors or coils to obtain a measurement in any number of selected positions and directions from the core of the magnetometer. The term "spheroid" is used because the actual spherical fit of the numerous measurement vectors or coils may not form a perfect sphere. The measurement vectors or coils may actual form an ellipsoid or varying size or shape, and thus the term calibration spheroid is used within the scope of the present invention to describe any shape formed by the various measurement vectors or coils. For calibration purposes, preferably at least 100 measurement vectors or coils are generated to form the calibration spheroid. More preferably, at least 1000 measurement vectors or coils are generated to form the calibration spheroid. Still more preferably, at least 10,000 measurement vectors or coils are generated to form the calibration spheroid. Yet more preferably, at least 100,000 measurement vectors or coils are generated to form the calibration spheroid. Even more preferably, at least 200,000 measurement vectors or coils are generated to form the calibration spheroid. Still yet more preferably, at least 300,000 measurement vectors or coils are generated to form the calibration spheroid. Yet even more preferably, at least 400,000 measurement vectors or coils are generated to form the calibration spheroid. Even still more preferably, at least 500,000 measurement vectors or coils are generated to form the calibration spheroid. Yet still more preferably, at least 600,000 measurement vectors or coils are generated to form the calibration spheroid. Still even more preferably, at least 700,000 measurement vectors or coils are generated to form the calibration spheroid. Even yet more preferably, at least 800,000 measurement vectors or coils are generated to form the calibration spheroid. Still yet even more preferably, at least 900,000 measurement vectors or coils are generated to form the calibration spheroid. Yet even still more preferably, at least 1,000,000 measurement vectors or coils are generated to form the calibration spheroid. Moreso, the calibration spheroid is preferably generated and regenerated substantially continuously, such that as soon as a calibration spheroid is completed and the magnetometer is calibrated according thereto, the process begins again forming a new calibration spheroid to again recalibrate the magnetometer substantially continuously. Once the calibration spheroid is complete, a virtual vector is generated connecting the local maximum and local minimum measurement values. This virtual vector effectively represents the environmental magnetic field—typically the Earth's magnetic field—by virtue of the fact that the local maximum value is representative of the strongest magnetic pull from the environment, thus elongating or shifting the measurement vector in that direction, while the local minimum value is contraindicative of said environmental magnetic pull as such magnetic forces shorten the measurement vector by pulling it in the exact opposite direction from which it was directed for measurement. In other words, the virtual vector created by connecting the local minimum and maximum measurement vector values gives a direct indication of the direction of the strongest environmental magnetic field. Repeating this calibration sphere and virtual vector generation process repeatedly allows the magnetometer to likewise repeatedly be calibrated to the environmental magnetic field with each iteration. Once the vector generation module determines the particular pattern in which the calibration spheroid should be generated, the function generator then powers the drive coils with the appropriate drive characteristics to generate the individual measurement vectors in the prescribed pattern.

Other methods for extracting or measuring a reference magnetic field (e.g., the Earth's magnetic field) may be utilized as well. As noted above, the local minimum and local maximum values of the calibration sphere measurement vectors or coils may be used. Alternatively, the local maximum and minimum values may be determined, and then local surface fits for those local minimum and maximum values can be determined and a virtual connecting vector created between those surface fits similar to the method described above. Alternatively, full surface fits may be calculated for the enter set or series of measurement vectors or coils, and the local maximum and minimum of the surface fits may be calculated and connected by a virtual vector, as opposed to the measurements of individual measurement vectors or coils. Such surface fits may be spherical or ellipsoidal in any geometry that can best be used to describe the magnetic field of the sensor and or the environment. Time based similarity methods may also be used whereby vectors are smoothed between the transitions of time steps. These, or other methods of actually using the calibration spheroid to detect the environmental (e.g., Earth's) magnetic field may be interchangeably used with the various methods and elements of the present invention.

As noted above, the vector generation module determines a pattern or order in which the measurement vectors or coils are to be created to generate the calibration spheroid. Many different patterns can be envisioned. For example, a "patterned" approach may be used where the vector generation module directs the formation of the calibration spheroid by creating measurement vectors or coils in a cyclic, sweeping pattern. For example, if the first measurement vector or coil is created along the x axis (in one or both directions from the core), then the next measurement vector or coil may be created within the z-y plane, but shifted from the x axis by some number or fraction of degrees. Subsequent measurement vectors or coils would be generated in this vein until creating a complete ring of measurement vectors or coils around the core, and then starting again in the x axis, but shifting the measurement coils by some number or fraction of degrees in the z axis, and completing another ring. Thus, the vector generation module directs the magnetometer to generate measurement vectors or coils in a sweeping, cyclic pattern until the calibration spheroid is complete. Another example is a stochastic method whereby the measurement vectors or coils are generated randomly, but preferably without repeating a given position or location until the calibration spheroid has been completed and a new one begun. Still another example is a random cyclic pattern where the measurement vectors or coils are generated in cyclical positions around a randomly evolving axis. Yet another example is a rotating cyclic approach where measurement vectors or coils are generating in a sweeping pattern around a periodically rotating axis. Still another example is a body fixed sweeping method wherein the measurement vectors or oils are generated by fixing the sensing area on a specific area of interest and generating the measurement vectors or coils to cover that area of interest. With specific regard to this body fixed sweep method, the area of interest may be, for example, a region surrounding the local maximum or local minimum values measured by a previous iteration. In this manner, the system may operate much more rapidly by focusing the measurement only on an isolated area, or areas. This is particularly useful for relatively static environments where the sensor and/or magnetic fields are not shifting in large degrees or very rapidly, and the sensor measurements can be focused in the particularly useful areas.

The improved magnetometer described herein is characterized by a series of enabling features described below. The first enabling feature of the above concept is a self-calibration capability. Many types of magnetometers (including fluxgate magnetometers) are susceptible to changes in temperature of the sensing elements (copper and the ferromagnets) and the addition and subtraction of ferrous materials nearby to the sensor. These errors are known as temperature and hard metal offsets. The magnetometer of the present invention is unique in that rather than requiring a factory calibration in controlled conditions and then working to limit the thermal variance and ferrous material exposure, this sensor can completely calibrate itself with each measurement, hundreds or even thousands of times per second. This is accomplished by capturing a virtual spheroid ($4\pi$ steradians) of points from the triaxial fluxgate, and then a magnetic vector can be drawn between the maximum and minimum points on that spheroid, as described above. By using the vector generation module to electrically but not physically rotate the sensitive axis of the sensor, the magnetic field along any 2 DoF azimuth and elevation can be sensed.

The second feature of the magnetometer of the present invention is that it can operate in high accuracy or high speed modes depending on the embodiment, mission or use. Preferably, for relatively static embodiments, missions or uses, calibration spheres with hundreds of thousands of points, where the "points" are represented by individual measurement vectors or coils, can be generated in 60 seconds or less. More preferably, calibration spheres with hundreds of thousands of points can be generated in 30 seconds or less for relatively static embodiments. Still more preferably, calibration spheres with hundreds of thousands of points can be generated in 15 seconds or less for relatively static embodiments. Yet more preferably, calibration spheres with hundreds of thousands of points can be generated in 5 seconds or less for relatively static embodiments. Even more preferably, calibration spheres with hundreds of thousands of points can be generated in 3 seconds or less for relatively static embodiments. Still yet more preferably, calibration spheres with hundreds of thousands of points can be generated in 1 second or less for relatively static embodiments. Yet even more preferably, calibration spheres with hundreds of thousands of points can be generated in 0.5 seconds or less for relatively static embodiments. Even still more preferably, calibration spheres with hundreds of thousands of points can be generated in 0.1 seconds or less for relatively static embodiments. Further, for such relatively static embodiments, preferably these calibration spheres can be generated to create a magnetic vector accurate to about 10 degrees or greater. More preferably, calibration spheres can be generated to create a magnetic vector accurate to about 5 degrees or greater for relatively static embodiments. Still more preferably, calibration spheres can be generated to create a magnetic vector accurate to about 3 degrees or greater for relatively static embodiments. Yet more preferably, calibration spheres can be generated to create a magnetic vector accurate to about 2 degrees or greater for relatively static embodiments. Even more preferably, calibration spheres can be generated to create a magnetic vector accurate to about 1 degree or greater for relatively static embodiments. Still yet more preferably, calibration spheres can be generated to create a magnetic vector accurate to about 0.5 degrees or greater for relatively static embodiments. Yet even more preferably, calibration spheres can be generated to create a magnetic vector accurate to about 0.1 degrees or greater for relatively static embodiments. Even still more preferably, calibration spheres can be generated to create a magnetic vector accurate to about 0.05 degrees or greater for relatively static embodiments. Still yet more preferably, calibration spheres can be generated to create a magnetic vector accurate to about 0.01 degrees or greater for relatively static embodiments.

For more dynamic embodiments, missions or uses, preferably calibration spheres with hundreds of points, where the "points" are again represented by individual measurement vectors or coils, can be generated in 5 seconds or less. More preferably, calibration spheres with hundreds of points can be generated in 1 second or less for relatively dynamic embodiments. Still more preferably, calibration spheres with hundreds of points can be generated in 0.5 seconds or less for relatively dynamic embodiments. Yet more preferably, calibration spheres with hundreds of points can be generated in 0.1 second or less for relatively dynamic embodiments. Even more preferably, calibration spheres with hundreds of points can be generated in 0.05 seconds or less for relatively dynamic embodiments. Still yet more preferably, calibration spheres with hundreds of points can be generated in .01 second or less for relatively dynamic embodiments. Yet even more preferably, calibration spheres with hundreds of points can be generated in 0.005 seconds or less for relatively dynamic embodiments. Even still more preferably, calibration spheres with hundreds of points can be generated in 0.001 seconds or less for relatively dynamic embodiments. Further, for such relatively dynamic embodiments, preferably these calibration spheres can be generated to create a magnetic vector accurate to about 20 degrees or greater. More preferably, calibration spheres can be generated to create a magnetic vector accurate to about 15 degrees or greater for relatively dynamic embodiments. Still more preferably, calibration spheres can be generated to create a magnetic vector accurate to about 10 degrees or greater for relatively dynamic embodiments. Yet more preferably, calibration spheres can be generated to create a magnetic vector accurate to about 5 degrees or greater for relatively dynamic embodiments. Even more preferably, calibration spheres can be generated to create a magnetic vector accurate to about 3 degrees or greater for relatively dynamic embodiments. Still yet more preferably, calibration spheres can be generated to create a magnetic vector accurate to about 1 degree or greater for relatively dynamic embodiments. Yet even more preferably, calibration spheres can be generated to create a magnetic vector accurate to about 0.5 degrees or greater for relatively dynamic embodiments. Even still more preferably, calibration spheres can be generated to create a magnetic vector accurate to about 0.1 degrees or greater for relatively dynamic embodiments.

The third feature of the magnetometer of the present invention is that it can virtually stabilize the sensitive axis when the vector generation module includes an IMU consisting of accelerometers, gyroscopes, or accelerometers and gyroscopes. In this way, particularly for highly dynamic missions, the sensitive axis can be decoupled from the body of the sensor (and by extension what the sensor is attached to) and move in an environmentally referenced frame. This can allow for a spinning system to operate in high accuracy mode.

The fourth feature of the magnetometer of the present invention is a variant of the third. Once the sensitive axis is decoupled from the body of the sensor, it can be used to sweep an area of interest, rather than reconstructing the whole sphere with each measurement as described in the third feature. For example, if the sensor started in the mode described in feature 3, and then a region of interest was determined, the sensor could transition to feature 4 and offer a high resolution, high update rate of a small region of interest, in one embodiment monitoring the direction of earth's magnetic field. Effectively, this is a handshake capability that allows the magnetometer to switch from lower resolution, high range measurements to a more refined higher resolution, lower range of measurements for the region of interest.

A fifth feature of the magnetometer of the present invention allows the sensor to reject certain types of errors from magnetic pollution. By keeping track of the "volume" of the calibration sphere, the sensor can track when new magnetic fields have entered its sensitive region. Also the gradient of the surface of the sphere can be tracked for anomalous values. When it is too steep, then the magnetic field coming from that direction is likely a pollutant. These features have applicability to a wide variety of applications including GPS denied inertial navigation, UAVs, precision projectiles, fuzes, metal detectors, surveying equipment, mapping equipment, magnetic anomaly detectors, and high performance IMUs.

The individual low-end IMUs further preferably comprise a processor or controller, more preferably a microcontroller, to integrate and process the sensor signals in order to supply output data related to the conditions measured by the sensors. The processor or controller can be predictive or can respond and actuate any number of other systems such as control systems, guidance and navigation or alarm or warning systems. The controller preferably utilizes one or more digital microprocessors to process signals provided by the various sensors and deliver deployment, activation, or actuation commands to these other systems. Preferably, the present invention utilizes at least one accelerometer (if one is used, then preferably it is a 3-axis accelerometer), but may preferably also include at least one gyroscope (again, if one, then a 3-axis gyroscope), a magnetometer, and/or separate integrated sensor package consisting of at least one or more of these same types of sensors, thus providing redundancy. This redundancy in sensor(s) serves at least two beneficial purposes and although multiple sensors may be used on any individual IMU, in many embodiments the redundancy is at least provided by the utilization of multiple individual low-end IMUs to create a multi-IMU system where redundancy is a result of measurement from at least two or more of the individual IMUs. First, it allows for a significant increase in precision with the customized separate sensor package but in a reduced sensor range (for example +/−16 G, 2,000 dps). The firmware of the IMUs is designed in such a manner that it will be able to adaptively switch between the separate integrated sensor package and the direct accelerometer/gyroscope combination in the IMU at the onset of saturation of each of the sensor's dynamic range. Second, this redundancy allows for an overdetermined system when used to estimate the state/orientation of the projectile. The outputs provided by the additional sensors are always available so that a robust, consistent solution will exist based on IMU outputs. The combination of individual sensors and the separate integrated sensor package allows the present invention to reduce footprint and increase capabilities of the IMUs, particularly when combined in multiples. An additional gyroscope may further be integrated to capture the high-spin environment prior to controlled flight. The IMUs are capable of adaptively transitioning between the gyroscope on separate integrated sensor package and that directly on the IMUs, or between groupings of IMUs.

The present invention still further utilizes, in many embodiments, a transceiver for communicating information between the multi-IMU system and a user. The transceiver is designed to send key information back to the user (e.g., warfighter, response vehicle, remote monitoring station and/or personnel), which can include images/video (EO/IR) and/or travel data (attitude, velocity, position, time of travel, etc.). This information can be used for target identification and prioritization, or location and navigation. The transceiver is designed to be scalable for multiple platforms. In the example of munitions or weaponry, the transceiver can be integrated with imaging technology in a low velocity 40 mm round to provide the user with target detection, identification and tracking. Or, the transceiver can be integrated into a 40 mm surveillance/observation round in order to provide the user strategic battlefield information including assessing battle damage. In this example, the imaging technologies, power management and integration information can be scaled among these varying applications. Other applications include communicating with UAVs/drones, performing target prioritization in flight and offering situational awareness information to the user. Preferably, the transceiver is a radio frequency (RF) transceiver that operates under a frequency-hopping spread spectrum (FHSS) method that rapidly changes and switches communication among a number of frequencies or channels in a pseudorandom sequence that is shared and known by both the transceiver and the remote interface. FHSS is a wireless technology that spreads its signal over rapidly changing frequencies. Each available frequency band is divided into sub-frequencies. Signals rapidly change ("hop") among these in a predetermined order. Interference at a specific frequency will only affect the signal during that short interval. Further, the transceiver preferably communicates image and/or travel data in real-time. This real-time communication allows a remote user the ability to take control of the projectile or vehicle and perform user-controlled flight from a remote location, or to provide real-time feedback to an individual. The user is fed the image and flight data from the projectile, vehicle or individual in-travel, and through a user interface, send live commands or controls back to the projectile, vehicle or individual in-travel to guide, maneuver or otherwise control the projectile or vehicle, or provide feedback, information or guidance to an individual.

Many embodiments of the present invention further comprise at least one temperature sensor. At least one temperature sensor may be included in the multi-IMU system such that it measures a local temperature about the entire system. Alternatively, individual temperature sensors may be comprised in one or more of the individual low-end IMUs. With multiple temperature sensors, the temperate of each individual IMU or a grouping of IMUs may be obtained. Obtaining a localized temperature measurement, particularly when localized to individual IMUs or groups of IMUs, allows for temperature compensation to be performed. Temperature compensation allows the system to accommodate for differences in temperature between two or more of the individual low-end IMUs and the shift, drift, error, or other differences that can arise based on differing temperatures between the individual low-end IMUs. This is particularly important based on the need for redundancy in measurement between individual low-end IMUs. If one or a group of IMUs is at a different temperature than the rest or other groups, then the individual sensor measurements of each IMU may be skewed or inaccurate with respect to the rest. Thus, in many embodiments, it is important to include at least one, or more preferably a plurality of temperature sensors to allow the system to compensate for such differences in temperatures between individual low-end IMUs, or groups thereof, and ensure accurate and repeatable measurements for each IMU, or to perform the necessary calculations to account for such differences. Temperature sensor measurements may then be factored into the individual low-end IMU measurements such that the individual IMU calculations are normalized to a single IMU, or group thereof, and measurements can be made accurately across the entire multi-IMU system.

The present invention also includes a printed circuit board (PCB), or a series thereof, on which the individual IMUs are to be mounted. The PCB is intended to support and electrically connect each of the components, particularly a plurality of IMUs, attached thereto. Preferably, each PCB has an upper surface and a lower surface, and in many embodiments, both surfaces are electrically conductive and populated with a plurality of IMUs. Although has few as one IMU may be used, preferably multiple IMUs are utilized, and the number of PCBs employed depends on the number of IMUs. Each PCB may include as few as one IMU. More preferably each PCB includes at least two IMUs. Yet more preferably, each PCB includes at least 4 IMUS. Still more preferably, each PCB includes at least 6 IMUs. Even more preferably, each PCB includes at least 8 IMUs. Still yet more preferably, each PCB includes at least 10 IMUs. Even still more preferably, each PCB includes at least 12 IMUs. Still yet more preferably, each PCB includes at least 14 IMUs. Still more preferably, each PCB includes at least 16 IMUs. Yet still more preferably, each PCB includes at least 18 IMUs. Even yet more preferably, each PCB includes at least 20 IMUs. Even still more preferably, each PCB includes at least 22 IMUs. Yet even still more preferably, each PCB includes at least 24 IMUs. Even still yet more preferably, each PCB includes at least 26 IMUs. Still yet even more preferably, each PCB includes at least 28 IMUs. Even yet still more preferably, each PCB includes at least 28 IMUs. Yet still even more preferably, each PCB includes at least 30 IMUs. Still even yet more preferably, each PCB includes at least 32 IMUs. Even still yet more preferably, each PCB includes at least 34 IMUs. More preferably still, each PCB includes as many as 36 IMUs. Further, multiple PCBs may be combined as well to further multiply the number of individual low-end IMUs present in the multi-IMU system.

The total number of PCBs, and thus the total number of low-end IMUs, is only limited by the constraints of the application for which the multi-IMU systems are being designed. A multi-IMU for a projectile is limited at least in part by the size, shape, and aerodynamic requirements of the projectile. A multi-IMU for a first responder or military personnel is limited at least by the form factor of the housing and weight requirements for ease of use by the individual. A multi-IMU for an automobile or other vehicle is limited at least by the size and shape of the housing where the multi-IMU will be mounted. With respect to the constraints of each individual embodiment, it is preferable that the multi-IMU comprise at least one PCB board with a plurality of IMUs mounted on each board. More preferably, the multi-IMU comprises at least two PCB boards with a plurality of IMUs mounted on each board. Still more preferably, the multi-IMU comprises at least three PCB boards with a plurality of IMUs mounted on each board. Yet more preferably, the multi-IMU comprises at least four PCB boards with a plurality of IMUs mounted on each board. Even more preferably, the multi-IMU comprises five or more PCB boards with a plurality of IMUs mounted on each board. Given the number of PCB boards utilized for a given embodiment of the present invention, it is preferably that the multi-IMU system comprises at least 1 IMUs. More preferably, the multi-IMU system comprises at least 2 IMUs. Yet more preferably, the multi-IMU system comprises at least 4 IMUs. Still more preferably, the multi-IMU system comprises at least 8 IMUs. Even more preferably, the multi-IMU system comprises at least 12 IMUs. Still even more preferably, the multi-IMU system comprises at least 16 IMUs. Even yet more preferably, the multi-IMU system comprises at least 20 IMUs. Yet still more preferably, the multi-IMU system comprises at least 24 IMUs. Still yet more preferably, the multi-IMU system comprises at least 28 IMUs. Yet even more preferably, the multi-IMU system comprises at least 32 IMUs. Even still more preferably, the multi-IMU system comprises at least 36 IMUs. Even yet more preferably, the multi-IMU system comprises at least 40 IMUs. Yet even more preferably, the multi-IMU system comprises at least 44 IMUs. Even still more preferably, the multi-IMU system comprises at least 48 IMUs. Still even yet more preferably, the multi-IMU system comprises at least 52 IMUs. Even yet still more preferably, the multi-IMU system comprises at least 56 IMUs. Yet still even more preferably, the multi-IMU system comprises at least 60 IMUs. Yet more preferably, the multi-IMU system comprises at least 64 IMUs. Even yet more preferably, the multi-IMU system comprises at least 68 IMUs. Still more preferably, the multi-IMU system comprises at least 72 IMUs. Yet even more preferably, the multi-IMU system comprises at least 76 IMUs. Even still more preferably, the multi-IMU system comprises 80 or more IMUs. Again, the total number of low-end, low resolution IMUs is only limited by the number of boards that can fit within the constraints of the particular embodiment, and more IMUs contained in the multi-IMU leads to even greater accuracy and precision of measurement.

Depending on the number of IMUs that are present, the IMUs can be configured in a number of orientations and locations. Preferably, each surface of the PCB is divided into four quadrants, each individually separate but interconnected with the other through the wiring of the PCB as well as firmware contained in the processor(s) or microprocessor(s). Preferably, the IMUs, when mounted in multiples, are each mounted in a different geometric, directional and special orientation. An example of this orientational mounting can be found in FIG. 1. Mounting each IMU in a given quadrant in a different orientation allows for the multi-IMU sensor system to be largely self-calibrating. Redundant measurements are obtained from each individual IMU, but each is oriented differently, thus allowed the system to coordinate the measurements and calibrate the system based on the measurements of each IMU. If one IMU begins to drift or develops of bias or shift, the difference will be evident in relation to at least one of the many other IMUs present in most embodiments. Thus, the drifting IMU can be recalibrated to be accurate, or the shift/bias/drift can be accounted for in any ongoing measurements. Each surface of the PCB is effectively a two-dimensional surface upon which the IMUs are mounted. Accordingly, the IMUs are preferably mounted in a different orientation in the y-axis and z-axis of the given surface of the PCB, where the x-axis is that perpendicular to the surface of the PCH and going into and through the PCB. By way of example, if each IMU were to have an effective top or prime direction, then the top or prime direction of each IMU can be mounted on the surface of the PCB in a given quadrant such that each IMU in the quadrant faces a different direction. In this example, one may assume that if one IMU is mounted with its top or prime direction to the "north" of the PCB quadrant, then each of the other IMUs mounted within that quadrant should be mounted with their top or prime direction in a different direction relative to the y- and z-axes of the board. In most embodiments, each quadrant may include up to 4 IMUs, though with advancements in miniaturization, more IMUs may be configured within each quadrant. Thus, in many embodiments, each PCB may include up to 32 IMUs—4 in each quadrant of each surface. As noted above, each of the IMUs are interconnected both electrically through the conduits of the PCB, and through firmware. Various firmware routines can be envisioned linking the individual low-end IMUs such that the IMUs perform their measurements in any sequence, order, or combination thus providing redundant and substantially continuous measurement. Each of the individual IMUs exhibits a signal that corresponds to any one or more of the sensors contained thereon (e.g., accelerometer, gyroscope, magnetometer, temperature sensors, and the like). The IMU signal may contain a single sensor measurement or may be a combination thereof, or may be a semi-processed or processed version of any combination.

Preferably, the entire multi-IMU is presented in am miniaturized form factor. In this vain, preferably, the multi-IMU is adapted to be produced in a package size less than 3 in$^3$. More preferably, the multi-IMU is adapted to be produced in a package size less than 2 in$^3$. Still more preferably, the multi-IMU is adapted to be produced in a package size less than 1.5 in$^3$. Yet more preferably, the multi-IMU is adapted to be produced in a package size less than 1 in$^3$. Even more preferably, the multi-IMU is adapted to be produced in a package size less than 0.9 in$^3$. Yet still more preferably, the multi-IMU is adapted to be produced in a package size less than 0.8 in$^3$. Still even more preferably, the multi-IMU is adapted to be produced in a package size less than 0.75 in$^3$. Even yet more preferably, the multi-IMU is adapted to be produced in a package size less than 0.7 in$^3$. Yet even more preferably, the multi-IMU is adapted to be produced in a package size less than 0.6 in$^3$. Even still more preferably, the multi-IMU is adapted to be produced in a package size less than 0.5 in$^3$.

In order to coordinate the signals from each of the IMUs, the present invention employs one or more algorithms, either on a central processor or on individual processors comprised on one or more of the individual low-end IMUs. Preferably, one or more of the individual low-end IMUs comprise a processor or microprocessor in order to perform at least localized coordination, pre-processing, and/or processing of the signals from the local sensors and/or IMUs. These processors may also receive and execute commands from outside sources or from a global processor that is adapted to coordinate, process, and to some degree control individual processors or microprocessors. Preferably, at least one guidance algorithm is employed, and is adapted to coordinate and synchronize all of the data from the individual IMUs, and to combine them in a manner that yields a generalized, global output that represents the combined total of all of the individual IMU measurements, but is in the form of a single IMU measurement. In other words, the guidance algorithm synthesizes all of the individual IMU data and combines it such that the output of the guidance algorithm is that of a single IMU. Preferably, the guidance algorithm calculates and outputs a guidance metric, either as part of the generalized, global output or as a separate and distinct output metric, where the guidance metric is preferably representative of the absolute or relative location or position of the body (e.g., projectile or vehicle) in which the system is employed. In embodiments where the guidance metric is a separate and distinct output, it is calculated based at least in part on the measurements from one or more individual IMUs, or the multi-IMU system as a whole. Another important consideration for the present invention is the offset, bias, drift, shift and other error that occurs in each individual low-end IMU. In some embodiments, localized error correction algorithms may be employed on processors or microprocessors on individual low-end IMUs in order to detect and correct or take into account these sources of error in the individual IMUs. Such algorithms may be employed on each individual IMU, or they may be employed on a sub-group basis, for example where a microprocessor on one individual IMU of a quadrant on the PCB corrects of such errors among all of the IMUs on that quadrant, and then transmits error-corrected data for all IMUs on that quadrant to a global or central processor and guidance algorithm. Alternatively, the central or global processor and guidance algorithm may coordinate and synthesize the data from all IMUs, or groups of IMUs, and correct or account for the errors in each accordingly. The type of system and combination of algorithms depends on the form factor of the multi-IMU system, and the constraints thereof regarding size and computing power required for the various algorithmic options.

The multi-IMU systems and methods of the present invention further include the ability to perform calibration steps among the sensors of the various individual IMUs, and of the multi-IMU system as a whole. As noted, in one exemplary embodiment, the PCBs of the present invention are divided into quadrants with one or more individual low-end IMUs mounted on each quadrant, preferably in different orientations with respect to the X, Y- and Z-axes of the board. With such a configuration, each IMU preferably takes redundant measurements with the sensors thereof. Over time, each IMU is subject to varying forms and degrees of error, with various biases, shifts, drifts, and the like. With redundant measurement among multiple IMUs, the signals from the sensors of each IMU may be coordinated and synchronized such that the signals from all can be normalized to a common set point. Although all of the IMUs are subject to the onset of such error, the likelihood of all of the IMUs experiencing such error in the same measurements, at the same times, to the same degrees is very low. Accordingly, the individual sensor measurements can effectively be monitored and the onset of error noticed as time passes. Thus, any detected error in any measurement of any sensor of any of the IMUs may be corrected by recalibrating the individual sensor or IMU, or by accounting for the detected error in the calculations of the system. This calibration is even further augmented by sequentially sampling the measurements from individual IMUs or groups of IMUs, thus providing a continuing error-check algorithm and system that monitors and detects error in the individual sensor or IMU measurements, which can be correlated to the other IMUs or groups of IMUs in order to more rapidly detect such error. Thus, the sensors and IMUs re substantially continuously calibrated against the other sensors and IMUs, all of which are normalized to obtain accurate and precise measurements even in the presence or onset of error in an individual sensor or IMU.

Many embodiments of the present invention include a handshake capability feature whereby different groupings of IMUs (e.g., individual IMUs, groups of IMUs and/or sub-groups of IMUs) are used to measure and guide the system under different conditions. As the particular body encounters changing external conditions, the electronics of the multi-IMU system change between various groupings of IMUs by providing a handshake signal indicating that one group of IMUs is to hand over control to a different group, subgroup of individual IMU. This capability enables the system to use varying configurations of IMUs to function and be active in the types of conditions and environments for which each group is best suited. Groupings of IMUs that provide larger dynamic range but a lower resolutions are useful to provide accurate measurement in harsher environments, but conversely, groupings of IMUs that provide more precise measurement at higher resolutions but in lower dynamic ranges can be used in less harsh environments.

The various embodiments of the present invention preferably utilizes a customizable and programmable grouping process for the IMUs in each embodiment whereby the specific groupings of IMUs, and the capabilities and ranges of each group, can be selected for the particular mission, platform, environment, or other such variable considered during operation of the invention. In the case of various projectiles, different types of projectiles experience different launch and flight conditions and environments. Therefore, it is preferable if the groupings of IMUs selected are tailored to the particular conditions the projectile is likely to experience. Depending on the type of body to which the Multi-IMU system is mounted for measurement, preferably, the Multi-IMU system comprises at least two groupings of IMUs for measuring different ranges of conditions. More preferably, the Multi-IMU system comprises at least three groupings of IMUs for measuring different ranges of conditions. Each of the groupings may cover specific and distinct ranges, or there may be some overlap between the ranges in order to provide redundancy at the transition points between ranges.

Artillery rounds may experience initial launch conditions, for example, of approximately 270 Hz in rotation and acceleration forces of up to nearly 30,000 g for as long as 15 ms upon launch. After that time, the artillery settles and stabilizes into its flight path. Thus, upon launch, a group of IMUs, for purposes of the present invention, that has a large dynamic range but lower resolution may be used to measure the artillery round's flight through the initial launch period under the harsh and unstable flight conditions, but can then handshake to a different set of IMUs when the round stabilizes and is not undergoing and experiencing the harsh launch conditions. With regard to gyroscopes measurement ranges of the IMUs, preferably, at least one group of IMUs is adapted to measure spin rates from about 0 Hz to about 25 Hz. Preferably, at least one group of IMUs is adapted to measure spin rates from about 25 Hz to about 50 Hz. Preferably, at least one group of IMUs is adapted to measure spin rates from about 50 Hz to about 100 Hz. Preferably, at least one group of IMUs is adapted to measure spin rates from about 100 Hz to about 150 Hz. Preferably, at least one group of IMUs is adapted to measure spin rates from about 150 Hz to about 250 Hz. Preferably, at least one group of IMUs is adapted to measure spin rates from about 250 Hz to about 500 Hz. Preferably, at least one group of IMUs is adapted to measure spin rates from about 500 Hz to about 1000 Hz. Another way to perceive the groupings of IMUs is in relation to the relative dynamic ranges as opposed to predefined spin rate value ranges. For example, preferably, in a Multi-IMU embodiment with electronics handshake capability, preferably, at least one group of IMUs is adapted to measure spin rates within a dynamic range of about 25 Hz. Preferably, at least one group of IMUs is adapted to measure spin rates within a dynamic range of about 50 Hz. Preferably, at least one group of IMUs is adapted to measure spin rates within a dynamic range of about 100 Hz. Preferably, at least one group of IMUs is adapted to measure spin rates within a dynamic range of about 150 Hz. Preferably, at least one group of IMUs is adapted to measure spin rates within a dynamic range of about 200 Hz. Preferably, at least one group of IMUs is adapted to measure spin rates within a dynamic range of about 250 Hz.

Preferably, at least one group of IMUs is adapted to measure spin rates within a dynamic range of about 300 Hz. Preferably, at least one group of IMUs is adapted to measure spin rates within a dynamic range of about 350 Hz. Preferably, at least one group of IMUs is adapted to measure spin rates within a dynamic range of about 400 Hz. Preferably, at least one group of IMUs is adapted to measure spin rates within a dynamic range of about 450 Hz. Preferably, at least one group of IMUs is adapted to measure spin rates within a dynamic range of about 500 Hz. Preferably, at least one group of IMUs is adapted to measure spin rates within a dynamic range of greater than 500 Hz. The larger the dynamic range of the IMU grouping, the lower the resolution of the measurements, and vice versa. Other ranges are envisioned that constitute overlapping ranges or simply different ranges. In one preferred embodiment, at least three groupings of IMUs are utilized where the gyroscope measurement ranges include a high dynamic range, low resolution grouping, a medium dynamic range, medium resolution grouping, and a low dynamic range, high resolution grouping. In such embodiment, preferably, at least one group of IMUs is adapted to measure spin rates from about 500 Hz to about 150 Hz, at least one group of IMUs is adapted to measure spin rates from about 150 Hz to about 50 Hz, and at least one group of IMUs is adapted to measure spin rates from about 50 Hz to about 0 Hz. In this exemplary, but non-limiting, embodiment, the 500-150 Hz range IMU group can be used upon initial firing or launching of the artillery round when the environment is volatile and harsh, but as the round stabilizes, the electronics controlling the measurement can handshake down to the 150-50 Hz grouping, and eventually to the 50-0 Hz grouping as the conditions allow for the lower dynamic range but higher resolution IMU groupings to be employed and provide accurate measurement. Similarly, with regard to accelerometer measurement ranges of the IMUs, preferably, at least one group of IMUs is adapted to measure accelerations of about ±1 g. Preferably, at least one group of IMUs is adapted to measure accelerations of about ±2 g. Preferably, at least one group of gyro IMUs scopes is adapted to measure accelerations of about ±4 g. Preferably, at least one group of IMUs is adapted to measure accelerations of about ±8 g. Preferably, at least one group of IMUs is adapted to measure accelerations of about ±10 g. Preferably, at least one group of IMUs is adapted to measure accelerations of about ±15 g. Preferably, at least one group of IMUs is adapted to measure accelerations of about ±20 g. Preferably, at least one group of IMUs is adapted to measure accelerations of about ±25 g. Preferably, at least one group of IMUs is adapted to measure accelerations of about ±30 g. Preferably, at least one group of IMUs is adapted to measure accelerations of about ±35 g. Preferably, at least one group of IMUs is adapted to measure accelerations of about ±40 g. Preferably, at least one group of IMUs is adapted to measure accelerations of about ±45 g. Preferably, at least one group of IMUs is adapted to measure accelerations of about ±50 g. Preferably, at least one group of IMUs is adapted to measure accelerations of greater than about ±50 g. Other ranges are envisioned that constitute overlapping ranges or simply different ranges. In one preferred embodiment, at least two groupings of IMUs are utilized where the accelerometer measurement ranges include a high dynamic range, low resolution grouping, and a low dynamic range, high resolution grouping. In such embodiment, preferably, at least one group of IMUs is adapted to measure accelerations of about ±50 g, and at least one group of IMUs is adapted to measure accelerations of about ±4 g. In this exemplary, but non-limiting, embodiment, the ±50 g range IMU group can be used upon initial firing or launching of the artillery round when the environment is volatile and harsh and subject to extreme acceleration, but as the round stabilizes and reaches a more consistent flight velocity, the electronics controlling the measurement can handshake down to the ±4 g grouping, as the conditions allow for the lower dynamic range but higher resolution IMU groupings to be employed and provide accurate measurement.

Mortar rounds experience different fire/launch and flight conditions however, and therefore a different IMU grouping and range conditions would be preferred in order to address the unique flight conditions mortar rounds face. A typical mortar round may experience initial launch or firing conditions, for example, of approximately 0-80 Hz in rotation and acceleration forces of up to nearly 15,000 g for as long as 8 ms upon launch. A 40 mm, however, might experience acceleration of as much as 25,000 g for a period of about 3 ms. Thus, even between different mortar platforms, there is a wide range of initial conditions that makes it difficult to prescribe a given range of IMUs across all platforms. Thus, upon launch, a group of IMUs, for purposes of the present invention, that has a large dynamic range but lower resolution may be used to measure the mortar round's flight through the initial launch period under the harsh and unstable flight conditions, but can then handshake to a different set of IMUs when the round stabilizes and is not undergoing and experiencing the harsh launch conditions. With regard to gyroscopes measurement ranges of the IMUs, preferably, at least one group of IMUs is adapted to measure spin rates from about 0 Hz to about 25 Hz. Preferably, at least one group of IMUs is adapted to measure spin rates from about 25 Hz to about 50 Hz. Preferably, at least one group of IMUs is adapted to measure spin rates from about 50 Hz to about 75 Hz. Preferably, at least one group of IMUs is adapted to measure spin rates from about 75 Hz to about 100 Hz. Preferably, at least one group of IMUs is adapted to measure spin rates from about 100 Hz to about 150 Hz. Preferably, at least one group of IMUs is adapted to measure spin rates from about 150 Hz to about 200 Hz. Preferably, at least one group of IMUs is adapted to measure spin rates from about 200 Hz to about 300 Hz. Preferably, at least one group of IMUs is adapted to measure spin rates from about 300 Hz to about 500 Hz. Another way to perceive the groupings of IMUs is in relation to the relative dynamic ranges as opposed to predefined spin rate value ranges. For example, preferably, in a Multi-IMU embodiment with electronics handshake capability, preferably, at least one group of IMUs is adapted to measure spin rates within a dynamic range of about 25 Hz. Preferably, at least one group of IMUs is adapted to measure spin rates within a dynamic range of about 50 Hz. Preferably, at least one group of IMUs is adapted to measure spin rates within a dynamic range of about 100 Hz. Preferably, at least one group of IMUs is adapted to measure spin rates within a dynamic range of about 150 Hz. Preferably, at least one group of IMUs is adapted to measure spin rates within a dynamic range of about 200 Hz. Preferably, at least one group of IMUs is adapted to measure spin rates within a dynamic range of about 250 Hz. Preferably, at least one group of IMUs is adapted to measure spin rates within a dynamic range of about 300 Hz. Preferably, at least one group of IMUs is adapted to measure spin rates within a dynamic range of about 350 Hz. Preferably, at least one group of IMUs is adapted to measure spin rates within a dynamic range of about 400 Hz. Preferably, at least one group of IMUs is adapted to measure spin rates within a dynamic range of about 450 Hz. Preferably, at least one group of IMUs is adapted to measure spin rates within a dynamic range of about 500 Hz. Preferably, at least one group of IMUs is adapted to measure spin rates within a dynamic range of greater than 500 Hz. Other ranges are envisioned that constitute overlapping ranges or simply different ranges. In one preferred embodiment, at least two groupings of IMUs are utilized where the gyroscope measurement ranges include at least a high dynamic range, low resolution grouping, and a low dynamic range, high resolution grouping. In such embodiment, preferably, at least one group of IMUs is adapted to measure spin rates from about 0 Hz to about 100 Hz, and at least one group of IMUs is adapted to measure spin rates from about 100 Hz to about 300 Hz. In this exemplary, but non-limiting, embodiment, the 300-100 Hz range IMU group can be used upon initial firing or launching of the mortar round when the environment is volatile and harsh, but as the round stabilizes, the electronics controlling the measurement can handshake down to the 100-0 Hz grouping as the conditions allow for the lower dynamic range but higher resolution IMU groupings to be employed and provide accurate measurement. Similarly, with regard to accelerometer measurement ranges of the IMUs, preferably, at least one group of IMUs is adapted to measure accelerations of about ±1 g. Preferably, at least one group of IMUs is adapted to measure accelerations of about ±2 g. Preferably, at least one group of gyro IMUs scopes is adapted to measure accelerations of about ±4 g. Preferably, at least one group of IMUs is adapted to measure accelerations of about ±8 g. Preferably, at least one group of IMUs is adapted to measure accelerations of about ±10 g. Preferably, at least one group of IMUs is adapted to measure accelerations of about ±15 g. Preferably, at least one group of IMUs is adapted to measure accelerations of about ±20 g. Preferably, at least one group of IMUs is adapted to measure accelerations of about ±25 g. Preferably, at least one group of IMUs is adapted to measure accelerations of about ±30 g. Preferably, at least one group of IMUs is adapted to measure accelerations of about ±35 g. Preferably, at least one group of IMUs is adapted to measure accelerations of about ±40 g. Preferably, at least one group of IMUs is adapted to measure accelerations of about ±45 g. Preferably, at least one group of IMUs is adapted to measure accelerations of about ±50 g. Preferably, at least one group of IMUs is adapted to measure accelerations of greater than about ±50 g. Other ranges are envisioned that constitute overlapping ranges or simply different ranges. In one preferred embodiment, multiple groupings of IMUs are utilized where the accelerometer measurement ranges include a progressive range of IMUs adapted for decreasing dynamic range and increasing resolution, or vice versa, to account for changes in flight conditions and environments. In such embodiment, preferably, at least one group of IMUs is adapted to measure accelerations of about ±16 g, at least one group of IMUs is adapted to measure accelerations of about ±8 g, at least one group of IMUs is adapted to measure accelerations of about ±4 g, and at least one group of IMUs is adapted to measure accelerations of about ±2 g. In this exemplary, but non-limiting, embodiment, the ±16 g range IMU group can be used upon initial firing or launching of the artillery round when the environment is volatile and harsh and subject to extreme acceleration, but as the round stabilizes and reaches a more consistent flight velocity, the electronics controlling the measurement can handshake down progressively between groupings, as the conditions allow for the lower dynamic range but higher resolution IMU groupings to be employed and provide accurate measurement.

In order to embody or enact the handshake capability, the present invention preferably includes a handshake algorithm adapted to receive input from the IMUs of the system and to determine the particular group or subgroup of IMUs that is best adapted to employ under the real-time flight or travel conditions. The IMUs of the present invention, either alone or in combination with each other, measure various conditions, states, movements or metrics of the body in which it is mounted, most commonly acceleration (1- or 3-axis acceleration via accelerometers) and/or spin rate (1- or 3-axis acceleration via gyroscopes), but other sensors may also be included such as magnetometers.

Regardless of the body or platform on which the Multi-IMU and electronic handshake systems are deployed, it is important to note that the IMU grouping can be either exclusive of one another or may overlap in ranges and provide redundant measurements. It is also important to note that any single individual IMU of the Multi-IMU system may be part of more than one grouping. Individual IMUs may be called upon as part of different groupings to achieve the desired dynamic range and/or resolution for the grouping. The groupings for handshake capability may be pre-defined as the module is produced or manufactured such that the various individual IMUs of a particular group are hardwired together to create a group, though more preferably the IMUs can be selected and programmed at any point, from production of the system through real-time use in-travel, to be part of a desired grouping.

Many embodiments of the present invention further include an internal ballistic module that can be used independently of the platform of body in which the Multi-IMU system is utilized. That is, while grouping of IMUs for handshake control purposes is dependent on whether the system is used on an artillery round vs. a mortar round, the internal ballistic module can be used across any platform. The internal ballistic module preferably comprises at least one 3-axis accelerometer, a processing component for processing data acquired from the sensor(s), and requires no g-switch to be activated. The internal ballistic module preferably captures 3-axis acceleration at launch or firing of the body on which the system is employed, and computes 3-axis velocity, position, and magnitude of the acceleration, velocity and position. The internal ballistic module can further be adapted to calculate muzzle velocity (for gun-fired rounds), update the fire control for the round (fuse), and for precise detonation of payloads on explosive rounds. The internal ballistic module is preferably adapted to provide internal ballistic estimations with an accuracy of less than 1% survival up to more than 60,000 g, does not need access to the external airframe of the body or projectile, does not need any access to the weaponized portion if a projectile, and is fully contained within the sensor suite. The internal ballistic module is preferably autonomous to the fire control (fuse) solution, and can give state and orientation of the body or projectile above or in addition to the measurements provided by typical IMUs to provide crisp, clean data at the point of launch or firing, in order to give maneuverability and control much earlier than rounds with traditional IMUs. The internal ballistic module is preferably adapted to be selectable between various acceleration ranges to accommodate multiple platforms and the various launch or fire conditions that the particular embodiment is likely to encounter. Also preferably, the internal ballistic module is adapted to have the handshake capability described above, and to perform such handshakes with any IMU, group of IMUs, or any other control or sensors systems down range, thus giving the internal ballistic module and it's self-contained and insulated measurement control over the launch or fire phase, and other systems control over downrange maneuverability and flight.

Accuracy, for the purposes of the present invention, can be measured or determined in numerous ways or by numerous metrics. With respect to navigation and guidance, or more accurately the measurements of IMUs and their sensors, accuracy of IMUs may often be measured by an error measurement of Angular Random Walk (ARW) which is a measurement of noise or error in the operation of an IMU, or of an individual sensor comprised in the IMU. An acceptable ARW value for a typical commercial grade IMU may be on the order of approximately $5°/\sqrt{hour}$; an acceptable ARW value for a typical industrial grade IMU may be on the order of approximately $3°/\sqrt{hour}$; an acceptable ARW value for a typical tactical grade IMU may be on the order of approximately $0.07°/\sqrt{hour}$; and an acceptable ARW value for a typical navigation grade IMU may be on the order of approximately $0.002°/\sqrt{hour}$. It is the goal of the present invention to provide multi-IMU systems and methods utilizing lower grade IMUs to create a multi-IMU system that exhibits tactical or even navigation grade performance. Thus, although the individual IMUs mounted on each PCB may be of commercial or industrial grade, the overall multi-IMU system performance is actually close to that of tactical or navigation grade IMUs. Accordingly, it is preferable that the multi-IMU system exhibit an angular random walk (ARW) value of $5°/\sqrt{hour}$ or less. More preferably, the multi-IMU system exhibits an ARW of $4°/\sqrt{hour}$ or less. Still more preferably, the multi-IMU system exhibits an ARW of $3°/\sqrt{hour}$ or less. Yet more preferably, the multi-IMU system exhibits an ARW of $2°/\sqrt{hour}$ or less. Even more preferably, the multi-IMU system exhibits an ARW of $1°/\sqrt{hour}$ or less. Still yet more preferably, the multi-IMU system exhibits an ARW of $0.5°/\sqrt{hour}$ or less. Yet even more preferably, the multi-IMU system exhibits an ARW of $0.1°/\sqrt{hour}$ or less. Even still more preferably, the multi-IMU system exhibits an ARW of $0.07°/\sqrt{hour}$ or less. Yet still more preferably, the multi-IMU system exhibits an ARW of $0.05°/\sqrt{hour}$ or less. Still even more preferably, the multi-IMU system exhibits an ARW of $0.03°/\sqrt{hour}$ or less. Even yet more preferably, the multi-IMU system exhibits an ARW of $0.01 °/\sqrt{hour}$ or less. Still even yet more preferably, the multi-IMU system exhibits an ARW of $0.009 °/\sqrt{hour}$ or less. Even yet still more preferably, the multi-IMU system exhibits an ARW of $0.007 °/\sqrt{hour}$ or less. Yet still even more preferably, the multi-IMU system exhibits an ARW of $0.005 °/\sqrt{hour}$ or less. Even still yet more preferably, the multi-IMU system exhibits an ARW of $0.003 °/\sqrt{hour}$ or less. Still yet even more preferably, the multi-IMU system exhibits an ARW of $0.002 °/\sqrt{hour}$ or less. Yet even still more preferably, the multi-IMU system exhibits an ARW of $0.001 °/\sqrt{hour}$ or less. The actual performance of the multi-IMU system may be dictated by the number of individual lower-grade IMUs that are used, which in turn may be dictated by the application and any constraints associated with such application.

Another way to gauge the performance of the multi-IMU system is by the relative improvement over the performance of any individual IMU contained therein. By such metrics, preferably the multi-IMU system exhibits an overall or global ARW that is less than % of the ARM of any individual lower-grade IMU comprised therein. More preferably the multi-IMU system exhibits an overall or global ARW that is less than 2/3 of the ARW of any individual lower-grade IMU comprised therein. Still more preferably, the multi-IMU system exhibits an overall or global ARW that is less than 1/3 of the ARW of any individual lower-grade IMU comprised therein. Yet more preferably, the multi-IMU system exhibits an overall or global ARW that is less than ¼ of the ARW of any individual lower-grade IMU comprised therein. Even more preferably, the multi-IMU system exhibits an overall or global ARW that is less than 1/10 of the ARW of any individual lower-grade IMU comprised therein. Still yet more preferably, the multi-IMU system exhibits an overall or global ARW that is less than 1/20 of the ARW of any individual lower-grade IMU comprised therein. Yet even more preferably, the multi-IMU system exhibits an overall or global ARW that is less than 1/50 of the ARW of any individual lower-grade IMU comprised therein. Even still more preferably, the multi-IMU system exhibits an overall or global ARW that is less than 1/75 of the ARW of any individual lower-grade IMU comprised therein. Still even more preferably, the multi-IMU system exhibits an overall or global ARW that is less than 1/100 of the ARW of any individual lower-grade IMU comprised therein. Even yet more preferably, the multi-IMU system exhibits an overall or global ARW that is less than 1/200 of the ARW of any individual lower-grade IMU comprised therein. Yet still more preferably, the multi-IMU system exhibits an overall or global ARW that is less than 1/400 of the ARW of any individual lower-grade IMU comprised therein. Still even yet more preferably, the multi-IMU system exhibits an overall or global ARW that is less than 1/600 of the ARW of any individual lower-grade IMU comprised therein. Even yet still more preferably, the multi-IMU system exhibits an overall or global ARW that is less than 1/800 of the ARW of any individual lower-grade IMU comprised therein. Yet still even more preferably, the multi-IMU system exhibits an overall or global ARW that is less than 1/1000 of the ARW of any individual lower-grade IMU comprised therein. Still even yet more preferably, the multi-IMU system exhibits an overall or global ARW that is less than 1/1250 of the ARW of any individual lower-grade IMU comprised therein. Even still yet more preferably, the multi-IMU system exhibits an overall or global ARW that is less than 1/1500 of the ARW of any individual lower-grade IMU comprised therein. Still yet even more preferably, the multi-IMU system exhibits an overall or global ARW that is less than 1/1750 of the ARW of any individual lower-grade IMU comprised therein. Yet even still more preferably, the multi-IMU system exhibits an overall or global ARW that is less than 1/2000 of the ARW of any individual lower-grade IMU comprised therein. Even yet still more preferably, the multi-IMU system exhibits an overall or global ARW that is less than 1/2250 of the ARW of any individual lower-grade IMU comprised therein. Yet still even more preferably, the multi-IMU system exhibits an overall or global ARW that is less than 1/2500 of the ARW of any individual lower-grade IMU comprised therein. Still even yet more preferably, the multi-IMU system exhibits an overall or global ARW that is less than 1/2750 of the ARW of any individual lower-grade IMU comprised therein. Even more preferably still, the multi-IMU system exhibits an overall or global ARW that is less than 1/3000 of the ARW of any individual lower-grade IMU comprised therein. Alternatively these metrics may be expressed as percentages of the ARW of the low-grade IMU.

Other measurements of error may also be used alternatively or in addition to ARW in order to determine the level of performance of the multi-IMU system. With specific respect to accelerometer measurements, accelerometer bias error (ABE) may be measured and used to compare the accuracy of the multi-IMU system to an individual IMU comprised therein. An acceptable ABE value for a typical commercial grade IMU may be on the order of approximately 125 mG; an acceptable ABE value for a typical industrial grade IMU may be on the order of approximately 3 mG; an acceptable ABE value for a typical tactical grade IMU may be on the order of approximately 0.3 mG; and an acceptable ABE value for a typical navigation grade IMU may be on the order of approximately 0.025 mG. Accordingly, it is preferable that the multi-IMU system exhibit an overall average accelerometer bias error (ABE) value of 125 mG or less. More preferably, the multi-IMU system exhibits an average ABE of 100 mG or less. Still more preferably, the multi-IMU system exhibits an average ABE of 75 mG or less. Yet more preferably, the multi-IMU system exhibits an average ABE of 50 mG or less. Even more preferably, the multi-IMU system exhibits an average ABE of 25 mG or less. Still yet more preferably, the multi-IMU system exhibits an average ABE of 10 mG or less. Yet even more preferably, the multi-IMU system exhibits an average ABE of 5 mG or less. Even still more preferably, the multi-IMU system exhibits an average ABE of 3 mG or less. Yet still more preferably, the multi-IMU system exhibits an average ABE of 1 mG or less. Still even more preferably, the multi-IMU system exhibits an average ABE of 0.75 mG or less. Even yet more preferably, the multi-IMU system exhibits an average ABE of 0.5 mG or less. Still even yet more preferably, the multi-IMU system exhibits an average ABE of 0.25 mG or less. Even yet still more preferably, the multi-IMU system exhibits an average ABE of 0.1 mG or less. Yet still even more preferably, the multi-IMU system exhibits an average ABE of 0.08 mG or less. Even still yet more preferably, the multi-IMU system exhibits an average ABE of 0.0 G mG or less. Still yet even more preferably, the multi-IMU system exhibits an average ABE of 0.04 mG or less. Yet even still more preferably, the multi-IMU system exhibits an average ABE of 0.02 mG or less. Again, the actual performance of the multi-IMU system may be dictated by the number of individual lower-grade IMUs that are used, which in turn may be dictated by the application and any constraints associated with such application.

Similarly, errors due to misalignment of the accelerometer may lead to inaccuracy and errors in the measurement or calculation of pitch and/or roll. Misalignment calibration accuracy, measured by accelerometer axis alignment, is therefore another useful metric for gauging the accuracy of the present invention. Typical accelerometer axis alignment (AAA) values for commercial grade IMU may be on the order of approximately 10,000 µrad or 0.57°; typical AAA values for industrial grade IMU may be on the order of approximately 1,000 µrad or 0.057°; typical AAA values for tactical grade IMU may be on the order of approximately 100 µrad or 0.057°; and typical AAA values for navigation grade IMU may be on the order of approximately 50 µrad or 0.0029°. Accordingly, it is preferable that the multi-IMU system exhibit an overall average accelerometer axis alignment (AAA) value of less than 10,000 µrad or 0.57°. More preferably, the multi-IMU system exhibits an average AAA of less than 5,000 µrad or 0.28°. Still more preferably, the multi-IMU system exhibits an average AAA of less than 1,000 µrad or 0.057°. Yet more preferably, the multi-IMU system exhibits an average AAA of less than 500 µrad or 0.028°. Even more preferably, the multi-IMU system exhibits an average AAA of less than 100 µrad or 0.0057°. Still yet more preferably, the multi-IMU system exhibits an average AAA of less than 50 µrad or 0.0029°. Again, the actual performance of the multi-IMU system may be dictated by the number of individual lower-grade IMUs that are used, which in turn may be dictated by the application and any constraints associated with such application.

Still another useful metric for measuring the accuracy of the multi-IMU system is the accelerometer scale factor which can lead to error errors in the measured orientation. Typical accelerometer scale factor error (ASFE) values for commercial grade IMU may be on the order of approximately 100,000 ppm; typical ASFE values for industrial grade IMU may be on the order of approximately 1,000 ppm; typical ASFE values for tactical grade IMU may be on the order of approximately 350 ppm; and typical ASFE values for navigation grade IMU may be on the order of approximately 100 ppm. Accordingly, it is preferable that the multi-IMU system exhibit an overall average accelerometer scale factor error (ASFE) value of less than 100,000 ppm. More preferably, the multi-IMU system exhibits an average ASFE of less than 10,000 ppm. Still more preferably, the multi-IMU system exhibits an average ASFE of less than 1,000 ppm. Yet more preferably, the multi-IMU system exhibits an average ASFE of less than 500 ppm. Even more preferably, the multi-IMU system exhibits an average ASFE of less than 250 ppm. Still yet more preferably, the multi-IMU system exhibits an average ASFE of less than 100 ppm. Again, the actual performance of the multi-IMU system may be dictated by the number of individual lower-grade IMUs that are used, which in turn may be dictated by the application and any constraints associated with such application.

Yet another useful metric for measuring the accuracy of the multi-IMU system is the gyroscope scale factor which can lead to error of the integration of angular rates during dynamic motion. Typical gyroscope scale factor error (GSFE) values for commercial grade IMU may be on the order of approximately 60,000 ppm; typical GSFE values for industrial grade IMU may be on the order of approximately 500 ppm; typical GSFE values for tactical grade IMU may be on the order of approximately 100 ppm; and typical GFE values for navigation grade IMU may be on the order of approximately 5 ppm. Accordingly, it is preferable that the multi-IMU system exhibit an overall average gyroscope scale factor error (GSFE) value of less than 60,000 ppm. More preferably, the multi-IMU system exhibits an average GSFE of less than 1,000 ppm. Still more preferably, the multi-IMU system exhibits an average GSFE of less than 500 ppm. Yet more preferably, the multi-IMU system exhibits an average GSFE of less than 250 ppm. Even more preferably, the multi-IMU system exhibits an average GSFE of less than 100 ppm. Still yet more preferably, the multi-IMU system exhibits an average ASFE of less than 100 ppm. Even still more preferably, the multi-IMU system exhibits an average ASFE of less than 50 ppm. Still even more preferably, the multi-IMU system exhibits an average ASFE of less than 10 ppm. Yet even more preferably, the multi-IMU system exhibits an average ASFE of less than 5 ppm. Again, the actual performance of the multi-IMU system may be dictated by the number of individual lower-grade IMUs that are used, which in turn may be dictated by the application and any constraints associated with such application.

Similar to accelerometers above, errors due to misalignment of the gyroscope may lead to inaccuracy and errors in the measurement or calculation of angular rate vector. Misalignment calibration accuracy, measured by gyroscope axis alignment, is therefore another useful metric for gauging the accuracy of the present invention. Typical gyroscope axis alignment (GAA) values for commercial grade IMU may be on the order of approximately 10,000 µrad or 3.6°; typical GAA values for industrial grade IMU may be on the order of approximately 1,000 µrad or 0.36°; typical GAA values for tactical grade IMU may be on the order of approximately 100 µrad or 0.036°; and typical GAA values for navigation grade IMU may be on the order of approximately 5 µrad or 0.0018°. Accordingly, it is preferable that the multi-IMU system exhibit an overall average gyroscope axis alignment (GAA) value of less than 10,000 µrad or 3.6°. More preferably, the multi-IMU system exhibits an average GAA of less than 5,000 µrad or 1.8°. Still more preferably, the multi-IMU system exhibits an average GAA of less than 1,000 µrad or 0.36°. Yet more preferably, the multi-IMU system exhibits an average GAA of less than 500 µrad or 0.18°. Even more preferably, the multi-IMU system exhibits an average GAA of less than 100 µrad or 0.036°. Still yet more preferably, the multi-IMU system exhibits an average GAA of less than 50 µrad or 0.018°. Even still more preferably, the multi-IMU system exhibits an average GAA of less than 5 µrad or 0.0018°. Again, the actual performance of the multi-IMU system may be dictated by the number of individual lower-grade IMUs that are used, which in turn may be dictated by the application and any constraints associated with such application.

Now referring to the figures and drawings, FIG. 1 is a schematic diagram depicting an exemplary embodiment of the present invention wherein multiple IMUs are configured on a single printed circuit board. The y- and z-axis are those perpendicular to each other along each surface of the board, and the z-axis is that which is perpendicular to the surface of the board, and extends through the board. Individual low-grade IMUs are mounted on the board in any number of combinations as disclosed here, and are preferably mounted in different orientations with respect to the y- and z- axes of the board. The figure depicts pin markers on the individual IMUs indication a reference point on the IMUs, and show that they are each mounted in a different orientation. The depicted embodiment comprises 32 individual low-grade IMUs—16 on each side, and 4 each in a quadrant of each surface of the board. The difference in orientation of IMUs is specific to each grouping of 4 IMUs on a quadrant. Thus, each quadrant comprises 4 IMUs in different orientations, although IMUs on different quadrants may be of the same orientation. This configuration allows the system to calibrate the individual IMUs with respect to each other as well as to provide redundant measurements that allow for calibration assistance, error checking and overall increased accuracy.

Figure 2:
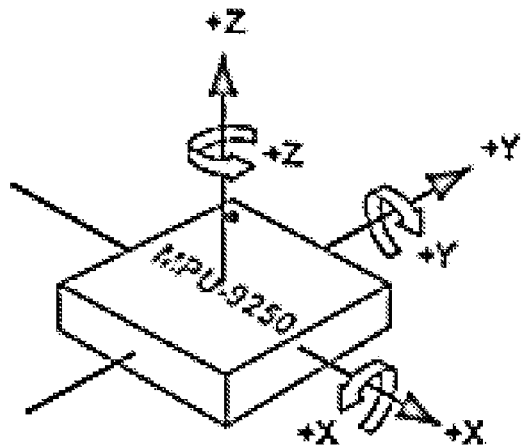
FIG. 2. Diagram depicting the orientation of the axes of sensitivity and the polarity of rotation for the accelerometer and gyroscope of a low-resolution IMU.

FIG. 2 is a diagram depicting the orientation of axes of sensitivity and the polarity of rotation for the accelerometer and gyroscope of an individual low-end or low-resolution IMU of the present invention. The multi-IMU, in many embodiments, preferably includes a plurality of the IMUs depicted in the present figure. Each individual IMU in the multi-UMU system is preferably interconnected with the others, at least via firmware, and are arranged in any number of patterns on the upper or lover surface of a PCB. The system preferably includes at least one processor comprising one or more algorithms adapted to receive and integrate data from the individual IMUs in order to produce a unified guidance output and/or guidance metric that is a much more accurate and precise measurement than any of the individual IMUs could provide on its own. The system also preferably calibrates the individual IMUs (as depicted) based on their relative location and orientation to each other and their absolute position and location on the PCB within the multi-IMU system. Preferably, one or more of the individual IMUs are oriented on the PCB in different orientation with respect to the depicted axes. Differing orientations enables the system to perform its calibration for the individual IMUs with respect to each other and thus the multi-IMU system as a whole. Once calibrated, the individual IMUs provide a series of redundant measurements that serve to provide accurate data and measurements in each axis, and can be integrated to yield a much more high resolution system than any individual IMU is capable of on its own. The system also preferably is adapted to select various groups or subgroups of individual IMUs based on their individual or collective specifications to operate under certain conditions, the groups or subgroups chosen preferably include a number of individual IMUs that are differently positioned on the PCB and differently oriented with respect to their axes to ensure the calibration and redundancy capabilities even when operating in smaller groups. When the conditions change, the system preferably provides a handshake, via a handshake algorithm, in order to select a different group or subgroup of individual IMUs that is better suited to operate under the new conditions. For example, under harsh conditions with a large range of variability, a high dynamic range-low resolution group of IMUs can be selected, but when conditions are relatively stable a lower dynamic range—higher resolution group can be used.

Figure 3:
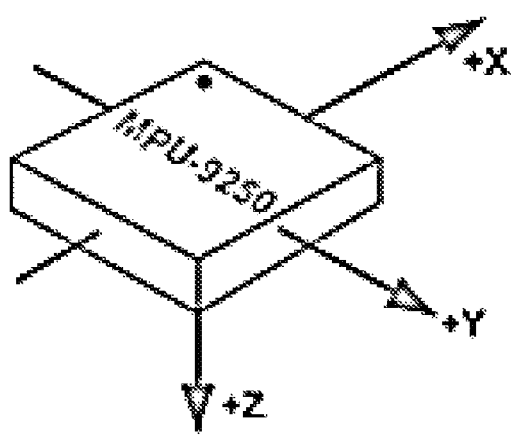
FIG. 3. Diagram depicting the orientation of the axes of sensitivity for a compass of a low-resolution IMU.

FIG. 3 is a diagram depicting the orientation of the axes of sensitivity for an optional compass of an individual low-end or low-resolution IMU of the present invention. The optional compass can help compensate for shift and/or bias in the other sensor(s) and provides an absolute frame of reference for the other sensor(s) present on the individual IMU, and thus aides in calibration of the individual IMU and more importantly the multi-IMU system.

Figure 4A:
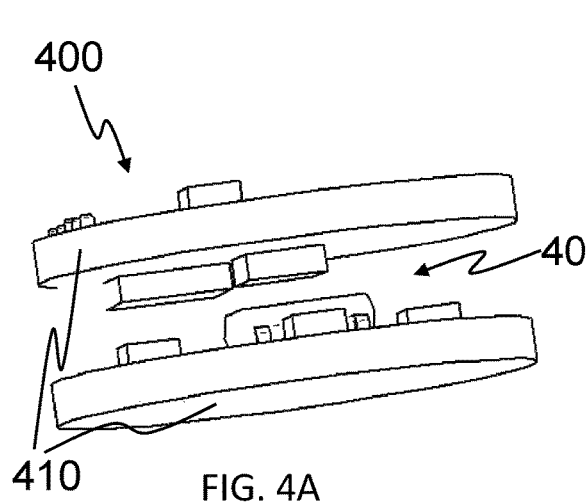
FIGS. 4A-D. Several views of one embodiment of an individual low-end IMU on a circuit board depicting various sensors, such views including A) perspective view, B) circuit diagram, C) side view, and D) top view.
Figure 4B:
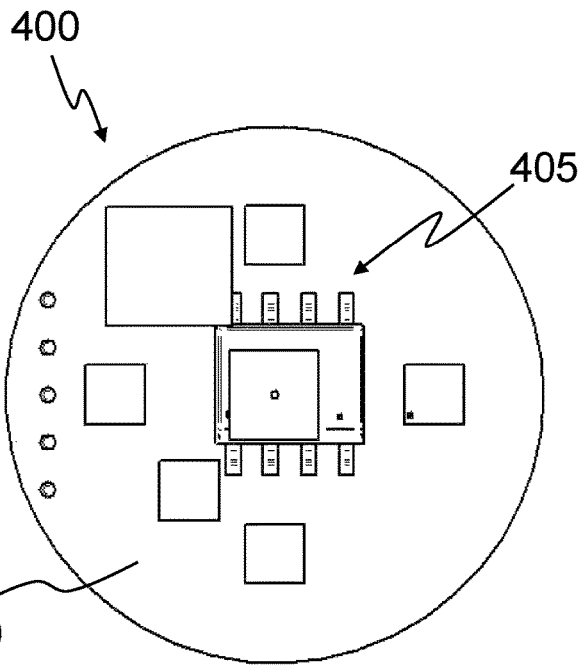
Figure 4C:
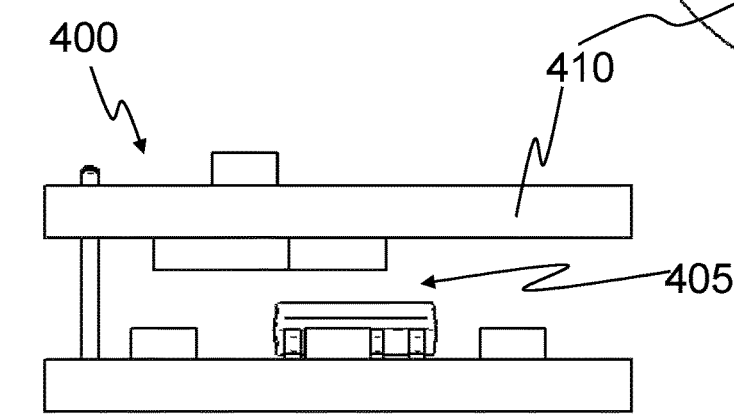
Figure 4D:
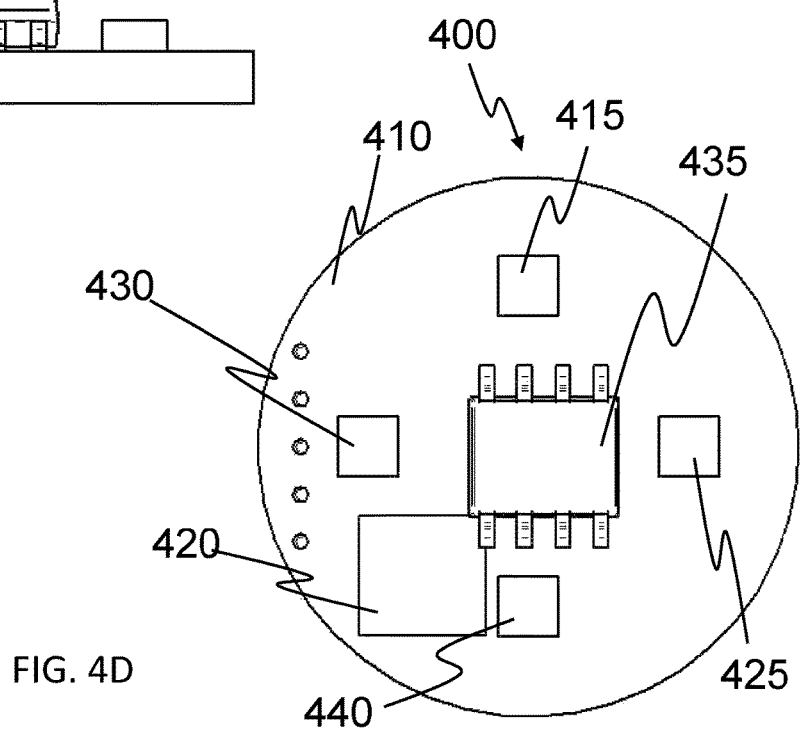

FIGS. 4A-D include several views of one embodiment of an individual low-end IMU of the present invention depicting various sensors, such views including A) perspective view, B) top view, C) side view, and D) alternative embodiment top view. FIG. 4A depicts a perspective view of an individual low-end IMU 400. The IMU 400 comprises a plurality of sensors 405 mounted on to a surface of a PCB 410. The plurality of sensors 405 may include any number and variety of the sensors discussed herein or known in the art, but preferably at least one accelerometer is present. FIG. 4B depicts a top view of one embodiment of an individual low-end IMU 400 comprising a PCB 410 and a plurality of sensors 405. The plurality of sensors 405 are shown in an arrangement with multiple sensors located at different radii from the center of the PCB. Different individual IMUs 400 comprising a multi-IMU (not shown) will preferably comprise he plurality of sensors 405 oriented and arranged in different locations on the PCB in order to provide redundant measurements for calibration purposes and for error check in measurements between IMUs 400. FIG. 4C is a side view depiction of the individual low-end IMU comprising a plurality of sensors 405 mounted on one or more PCBs 410. FIG. 4D depicts a top view of an alternative embodiment to that depicted in FIG. 4B, with a plurality of sensors mounted in different locations and orientations on the PCB 410. In the present embodiment, the IMU 400 includes a gyroscope 415, an accelerometer 420, a magnetometer 425, a processor or microprocessor 430, an integrated sensor suite 435 comprising one or more sensors (e.g., accelerometer, gyroscope, magnetometer, and the like), and a compass 440. This embodiment serves to show the numerous types of sensors and components that can be comprised on a single IMU, and when compared with FIGS. 4A-4C, depicts varying positioning and orientation of the sensors on the PCB 410. The separate integrated sensor suite 435 is a standalone unit that adds redundant sensors to the IMU 400 and preferably includes at least one or more of an accelerometer, gyroscope, magnetometer and processor or microprocessor. In the present invention, a number of these IMUS 400 are coupled together and together form a multi-IMU system as described herein.

Figure 5:
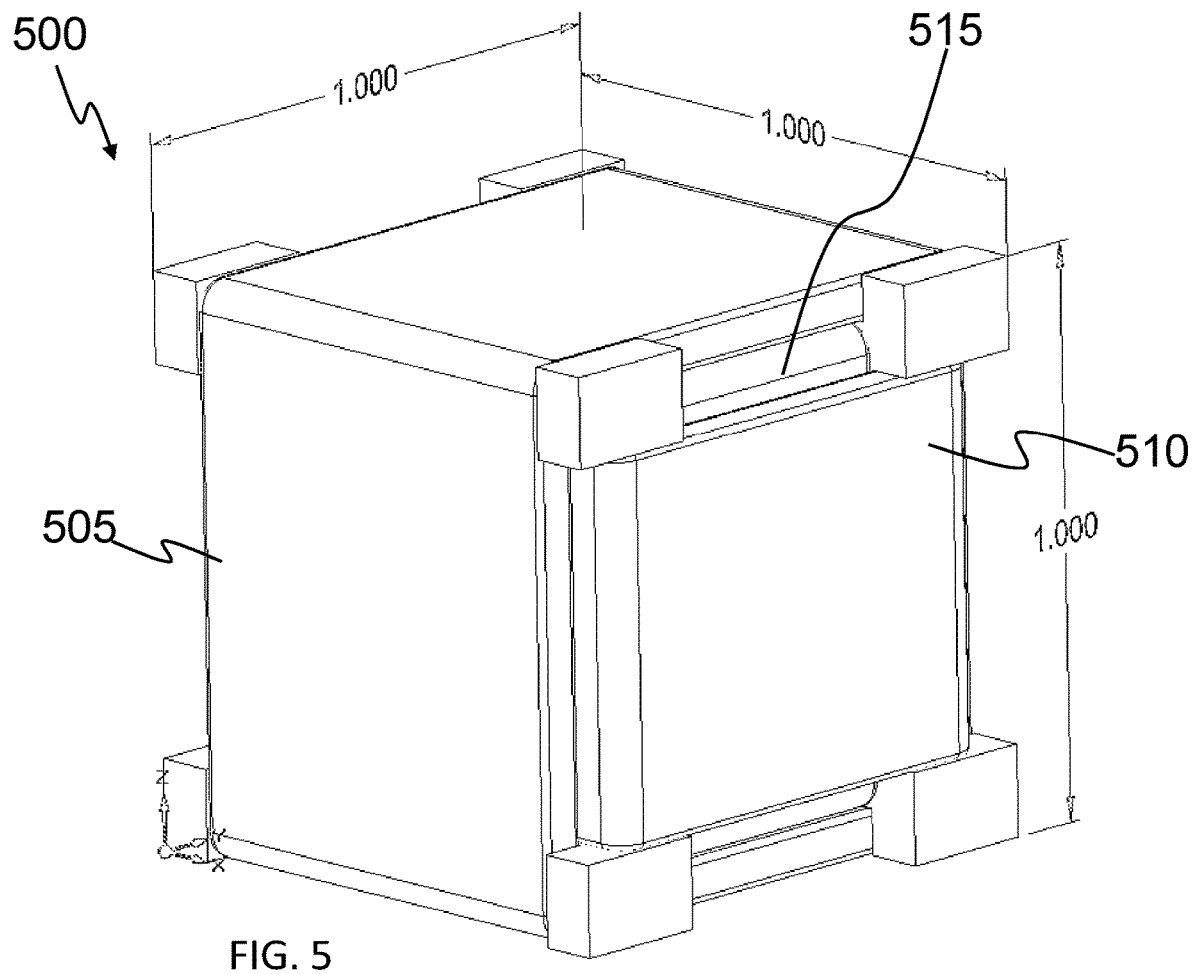
FIG. 5. Picture depicting a miniaturized self-calibrating magnetometer of the present invention.

FIG. 5 depicts one embodiment of the self-calibrating magnetometer 500 of the present invention. The depicted embodiment utilizes three coils, a coil for the X axis 505, a coil for the Y axis 515, and a coil for the Z axis 510. Other embodiments may further utilize additional coils as described above. The depicted magnetometer 500 highlights one main benefit of the magnetometer 500 of the present invention in that it is a self-calibrating fluxgate magnetometer that is scalable, and in particular is adapted to be miniaturized. The depicted embodiment contains scales which indicate that the dimensions of the magnetometer are approximately 1 inch in each dimension. Traditional self-calibrating fluxgate magnetometers are not capable to be scaled down to such dimensions, but the magnetometer of the present invention is able to based on the coil and electronic system combinations.

Figure 6:
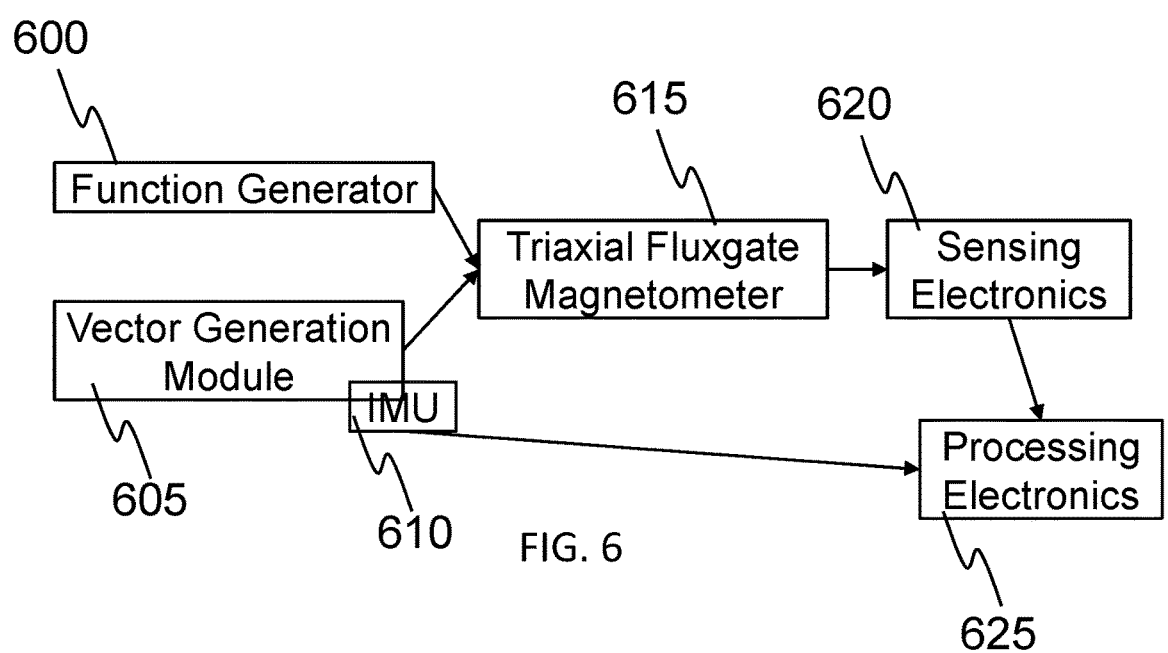
FIG. 6. Flow chart depicting the data flow for a self-calibrating magnetometer of the present invention.

FIG. 6 is a flow chart depicting the function of the magnetometer of the present invention and the flow of data in its operation. The function generator 600 operates to generate a waveform and frequency of drive signal pulses to be directed to each of the coils of the magnetometer. Meanwhile, the vector generation module 605 sets the pattern that will sweep through the sensor to pick up measurements in regards to the axes of the magnetometer. The embodiment(s) covered by the flow chart of the present figure include the optional IMU 610 integrated with the vector generation module. The vector generation module IMU 610 may include one or more accelerometers, one or more gyro scopes, or a combination of one or more of each of accelerometers and gyroscopes. The vector generation module IMU 610 allows for the system to virtually decouple the sensitive axis of the magnetometer from the body of the magnetometer and allow it to move in a frame as defined environmentally. Such embodiments are particularly useful for systems or bodies with high rates of spin for stabilization of the magnetometer data. The function generator 600 and the vector generation module cooperate to provide the drive signals to the magnetometer 615 in order to calibrate the magnetometer as often as the drive signal pulses are delivered. The magnetometer 615 then performs its measurement functions and provides its signal to sensing electronics 620 which effectively measure and acquire the sensor signal and transmit the signal to the processing electronics 625 for further processing, analysis, storage, or use in other systems. The vector generation module IMU 610 may also directly transmit its measurements to the processing electronics 625 for integration and reference with other measured data and processing.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

The invention claimed:

1. A dynamic magnetic vector fluxgate magnetometer system comprising:
   a ferromagnetic core;
   a plurality of pairs of mutually orthogonal drive coils surrounding the ferromagnetic core; and
   drive electronics adapted to provide power to one or more of the plurality of pairs of mutually orthogonal drive coils the drive coils or combinations of two or more drive coils in order to generate a drive field comprising multiple measurement vectors,
   the drive electronics comprising:
   1) a function generator adapted to determine a waveform and frequency of the drive field in part by determining a rate for alternation of the direction on the measurement vectors, and
   2) a vector generation module adapted to determine a pattern for orientation of the measurement vectors,
   wherein the waveform, frequency, and pattern for orientation are adapted to be provided to one or more of the plurality of pairs of mutually orthogonal drive coils the drive coils or combinations of two or more drive coils to generate the drive field, the measurement vectors adapted to measure a local magnetic field based at least in part on the drive field interacting with the ferromagnetic core; and a processor and a memory, the processor adapted to: 1) generate a virtual calibration spheroid, 2) calculate variances in magnitudes of the measurement vectors, and 2) calculate a volume of the virtual calibration spheroid, and the memory adapted to store measured vectors, the calculated variances, the volume of the virtual calibration spheroid, and/or a gradient of the virtual calibration spheroid's surface.

2. The magnetometer system of claim 1, wherein the drive electronics are adapted to create successive measurement vectors by changing the one or more drive coils to which power is provided and/or the amount of power provided to the one or more drive coils.

3. The magnetometer system of claim 2, wherein the drive signal frequency is between 5 kHz and 500 kHz, inclusive.

4. The magnetometer system of claim 3, wherein the vector generation pattern is selected from the group consisting of a patterned method generating vectors in a cyclic and sweeping pattern, a stochastic method generating vector addresses randomly, a random cyclic method generating vectors about a randomly evolving axis, a rotating cyclic method generating vectors by sweeping around a periodically rotating axis, and a body fixed sweep method generating vectors by fixing sensing on a specific area of interest.

5. The magnetometer system of claim 3, wherein the magnetometer is adapted to operate in high-speed mode or in high-accuracy mode, high-accuracy mode enabling the magnetometer to generate the calibration spheroid with at least 100,000 points in 60 seconds or less, and high-speed mode enabling the magnetometer to generate the calibration spheroid with at least 100 points in 1 second or less, each point corresponding to a planar vector generated by the vector generation module.

6. The magnetometer system of claim 5, further comprising an error-rejection module adapted to reject errors that are artifacts in measured vector data based on the volume of the calibration spheroid and the spatial gradient of the calibration spheroid's surface, the time gradient of the calibration spheroid, or the gradient of the spatial gradient with respect to time, where new magnetic fields detected in the calibration spheroid volume and a gradient that is substantially different compared to an expected value based on the gradient are indicative of magnetic pollution or temperature offsets.

7. The magnetometer system of claim 6, wherein at least one measurement vector is adapted to measure a local minimum magnetic field and a local maximum magnetic field and the local minimum magnetic field correlates negatively to the Earth's local magnetic field and the local maximum magnetic field correlates positively to the Earth's local magnetic field.

8. The magnetometer system of claim 7, wherein the processor is further adapted to generate a connecting vector to connect the local minimum and the local maximum magnetic fields, the connecting vector being indicative of Earth's local magnetic field.

9. The magnetometer system of claim 8, wherein the system is adapted to generate a calibration sphere comprising more than 100 measurement vectors or coils in 5 seconds or less.

10. The magnetometer system of claim 9, further comprising a transceiver adapted for communicating sensor data between the magnetometer system and a remote user.

11. The magnetometer system of claim 10, wherein the magnetometer system is a standalone magnetometer sensor unit.

12. The magnetometer system of claim 10, wherein the magnetometer is integrated into or associated with an inertial measurement unit (IMU).

13. The magnetometer system of claim 12, wherein the magnetometer system is comprised in a cellular phone or smart phone.

14. The magnetometer system of claim 12, wherein the magnetometer system is comprised in a vehicle and adapted to provide navigation data when encountering denied or degraded GPS signals.

15. The magnetometer system of claim 14, wherein the vehicle is an unmanned aerial vehicle (UAV) or other unmanned vehicle.

16. The magnetometer system of claim 12, wherein the magnetometer system is comprised in a guided projectile.

17. The magnetometer system of claim 1, wherein the magnetometer system is comprised in a cellular phone or smart phone.

18. The magnetometer system of claim 1, wherein the magnetometer system is comprised in a vehicle and adapted to provide navigation data when encountering denied or degraded GPS signals.

19. The magnetometer system of claim 18, wherein the vehicle is an unmanned aerial vehicle (UAV) or other unmanned vehicle.

20. The magnetometer system of claim 1, wherein the magnetometer system is comprised in a guided projectile.

* * * * *